(12) United States Patent
Carrasco et al.

(10) Patent No.: US 8,650,004 B2
(45) Date of Patent: Feb. 11, 2014

(54) METHOD AND APPARATUS FOR DISPLAYING A REPRESENTATION OF A TRAFFIC INTERSECTION

(75) Inventors: Milton Santano Elias Carrasco, Richmond (CA); Darren Earl Brown, Burnaby (CA); Guanggui Pei, New Westminster (CA); Steven Chi Kit Chan, Richmond (CA); Daniel Akwera Shihundu, Richmond (CA)

(73) Assignee: Transoft Solutions, Inc., Richmond, British Columbia (CA)

( * ) Notice: Subject to any disclaimer, the term of this patent is extended or adjusted under 35 U.S.C. 154(b) by 596 days.

(21) Appl. No.: 12/664,049

(22) PCT Filed: Nov. 26, 2008

(86) PCT No.: PCT/CA2008/002098
§ 371 (c)(1),
(2), (4) Date: Dec. 10, 2009

(87) PCT Pub. No.: WO2010/060180
PCT Pub. Date: Jun. 3, 2010

(65) Prior Publication Data
US 2011/0071801 A1    Mar. 24, 2011

(51) Int. Cl.
*G06F 17/50*    (2006.01)
(52) U.S. Cl.
USPC .............................................. 703/1
(58) Field of Classification Search
USPC ................... 703/1; 404/1; 472/2, 19, 3
See application file for complete search history.

(56) References Cited

U.S. PATENT DOCUMENTS

| 6,760,693 B1 * | 7/2004 | Desai et al. ................ 703/8 |
| 6,996,507 B1 * | 2/2006 | Myr .............................. 703/2 |
| 7,197,181 B1 | 3/2007 | Côté |

(Continued)

FOREIGN PATENT DOCUMENTS

| CA | 2271204 A1 | 6/1998 |
| CA | 2588576 A1 | 5/1999 |

(Continued)

OTHER PUBLICATIONS

State of Maryland Department of Transportation, Roundabout Design Guidleines, Oct. 1999, State of Maryland Department of Transportation, pp. 1-70.*

(Continued)

*Primary Examiner* — Omar Fernandez Rivas
*Assistant Examiner* — Bernard E Cothran
(74) *Attorney, Agent, or Firm* — Knobbe Martens Olson & Bear LLP

(57) ABSTRACT

A method and apparatus for displaying a representation of a traffic roundabout having a central island surrounded by a circulatory lane is disclosed. The method involves receiving an operator selection of a design vehicle that is expected to use the roundabout, and receiving operator input of a design dimension for the roundabout, the design dimension defining a size of one of the central island and an outer perimeter of the circulatory lane. The method also involves generating a circulatory path of the design vehicle traveling within the design dimension along the circulatory lane, and generating vehicle extent locations associated with passage of the design vehicle along the circulatory path. The method also involves using the vehicle extent locations to compute a circulatory lane width, and generating display signals for causing the display to display an image representing the roundabout.

62 Claims, 22 Drawing Sheets

(56) References Cited

U.S. PATENT DOCUMENTS

| | | | |
|---|---|---|---|
| 7,336,851 | B1 | 2/2008 | Côté |
| 7,447,616 | B2 * | 11/2008 | Wang et al. .................. 703/8 |
| 2002/0076276 | A1 * | 6/2002 | Troemel et al. ............... 404/1 |
| 2005/0210386 | A1 | 9/2005 | Schaffer |

FOREIGN PATENT DOCUMENTS

| | | |
|---|---|---|
| CA | 2349820 A1 | 5/2000 |
| CA | 2437903 A1 | 8/2002 |
| CA | 2571975 A1 | 1/2006 |
| CA | 2605012 A1 | 11/2006 |
| CN | 1958956 A | 9/2007 |
| WO | WO 00/28448 A1 | 5/2000 |
| WO | 2010/060180 A1 | 6/2010 |
| WO | WO 2010/060180 A1 | 6/2010 |

OTHER PUBLICATIONS

City of Colorado Springs—Transportation Engineering, Oct. 4, 2005, City of Colorado Springs—Transportation Engineering, pp. 1-22.*

International Search Report for PCT/CA2011/000753, mailed Sep. 15, 2011, 3 pages.

Nice, "Bentley Rail Track Update," *Bentley Systems UK*, downloaded from http://www.bentleyuser.se/2010_BUSdagar/doc/Bentley_Rail_Track_Update.pdf (2010).

Rohde, et al., "An interactive physics-based unmanned ground vehicle simulator leveraging open source gaming technology: Progress in the development and application of the virtual autonomous navigation environment (VANE) desktop," *Unmanned Systems Technology XI*, 14 pages (2009).

Wang, et al., "The sweep-envelope differential equation algorithm for general deformed swept volumes," *Computer Aided Geometric Design*, vol. 17(5), pp. 399-418 (2000).

International Search Report and Written Opinion for PCT/CA2012/000336, 12 pages, mailed Jul. 17, 2012.

Highways. www.Highways-Mag.Co.Uk. pp. 40-44. Jun. 2009. Traffic Calming. Magic Roundabouts. (available at http://c484350.r50.cf2.rackcdn.com/torus-design-magic.pdf).

Johns, Chris, Transoft Solutions. "Roundabouts No Longer Have Engineers Spinning Their Wheels. Dynamic software delivers solutions for BETA Group." Case Study. Torus Roundabouts. Feb. 13, 2013. (available at http://c484350.r50.cf2.rackcdn.com/Transoft_CaseStudy_Beta_Group_TORUS.pdf).

Ramos et al. "An Improved Roundabout Design Process with Computer Assisted Analysis." Submission Date: Mar. 26, 2010. pp. 1-17.

Ramos et al. "An Improved Roundabout Design Process with Computer Assisted Analysis." Accession No. 01338111. Publication date 2010. TRID the TRIS and ITRD database. Trid.trb.org/view.aspx?id=1099027. Downloaded Apr. 24, 2013.

User Testimonials. Torus Roundabouts. www.transoftsolutions.com/testimonials#torus. pp. 1-2. Downloaded Apr. 24, 2013.

In a roundabout way. Software review. CAD User. pp. 32 & 34. Nov./Dec. 2008. www.caduser.com/register.

Vestra Civil 3D. Transportation Design Software. AKG Software, Inc. Tarrytown, NY. www.akgsoftware.com as of Feb. 2007.

European Search Report for European Application No. 08874897.5 dated Oct. 2, 2013.

"Road Planning and Design Manual Chapter 14 Roundabouts." Jan. 18, 2006, XP055080238, Retrieved from the Internet: URL:http://www.tmr.qld.gov.au/~/media/busind/techstdpubs/Road%20planning%20and%20design%20manual/Current%20document/RPDM_Chapter14.pdf [retrieved on Sep. 20, 2013].

"Roundabouts." Jun. 1, 2007, XP055080241, Retrieved from the Internet: URL:http://www.th.gov.bc.ca/roundabouts/documents/740_Roundabouts.pdf [retrieved on Sep. 20, 2013].

Said Easa et al. "Optimizing geometric design of single-lane roundabouts: consistency analysis." Canadian Journal of Civil Engineering—Revue Canadienne Degenie Civil, National Research Council of Canada. 31(6):1024-1038 (Jan. 1, 2004).

* cited by examiner

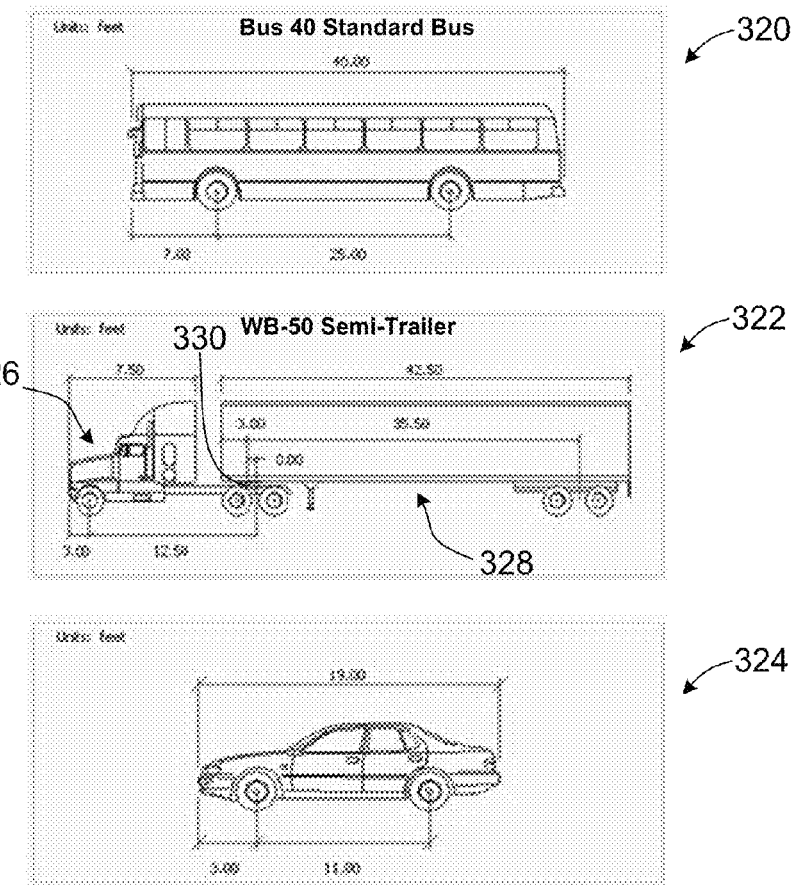

FIG. 5

| | | Vehicle Name | | | |
| --- | --- | --- | --- | --- | --- |
| | | Bus 40 Standard Bus | WB-50 Semi-Trailer | P Pasenger Car | Units |
| 342 ~ | Steering lock angle | 39.3 | 17.7 | 31.6 | degrees |
| 344 ~ | Length | 40 | 55 | 19 | ft |
| 346 ~ | Front Overhang | 6 | 3 | 3 | ft |
| 348 ~ | Width | 8.5 | 8 | 7 | ft |
| 350 ~ | Wheelbase | 25.85 | 12.5 (tractor only) | 11 | ft |
| 352 ~ | Front axle group track | 8.5 | 8 (tractor only) | 6 | ft |
| 354 ~ | Front axle group wheels | 2 | 2 (tractor only) | 2 | each |
| 356 ~ | Rear axle group track | 8.5 | 8 (tractor only) | 6 | ft |
| 358 ~ | Rear axle group wheels | 2 axles, 4 wheels on each | 2 axles, 4 wheels on each (tractor only) | 2 | each |
| 360 ~ | No of parts | 1 | 2 | 1 | each |
| 362 ~ | Pivot location | NA | 3 | NA | ft |
| 364 ~ | Trailer length | NA | 42.5 | NA | ft |
| 366 ~ | Articulating angle | NA | 70 | NA | degrees |

FIG. 6

METHOD AND APPARATUS FOR DISPLAYING A REPRESENTATION OF A TRAFFIC INTERSECTION

CROSS REFERENCE TO RELATED APPLICATION

This application is a U.S. National Stage Application of PCT/CA2008/002098, filed Nov. 26, 2008, the contents of which is hereby incorporated by reference in its entirety.

BACKGROUND OF THE INVENTION

1. Field of Invention

This invention relates generally to traffic intersections and more particularly to displaying a representation of a traffic intersection.

2. Description of Related Art

Traffic intersections may be designed by laying out the roadways and intersection area on a computer using a computer aided design (CAD) application. Once the roadways have been initially defined, the intersection may be tested to determine whether certain types of vehicle can pass through the intersection without encroaching on curbs or islands making up the intersection. The testing may involve generating a vehicle swept path by producing a scaled representation of the vehicle and then simulating passage of the design vehicle through the intersection to determine whether any encroachment exists. Should changes to the initial roadway definition be necessary to eliminate encroachments, features of the intersection would have to be manually modified and then the vehicle swept path regenerated.

Designing traffic roundabouts is particularly problematic. A roundabout is a traffic intersection having a central island surrounded by a circulatory roadway and having one or more approach roadways. The circulatory roadway includes at least one lane and should be sized to provide for adequate maneuvering space for different vehicles that will use the intersection. A designer of a roundabout will generally take into account a defined design vehicle that is expected to use the roundabout and may also face other constraints that should be simultaneously satisfied. For example, a fastest path of a defined passenger vehicle may be taken into account to ensure that smaller vehicles are not able to operate at unsafe speeds through a roundabout that is sized to permit passage of a large articulated vehicle.

Satisfying several constraints may involve defining an initial size and layout of the roundabout, which is then tested to determine whether the design vehicle is able to maneuver through the intersection without encroaching on the central island, outer edges of the circulatory roadway, or any other outer edges of the intersection. Should the design vehicle be able to pass without encroachment, the fastest path of a smaller design vehicle may also be determined and speeds of the vehicle along the path computed to determine whether the intersection meets safety criteria. Should changes to the initial layout be necessary to satisfy either of these constraints, the process may have to be repeated for each change, resulting in an iterative process that may become tedious and time consuming.

There remains a need for improved methods for producing representations of traffic intersections.

SUMMARY OF THE INVENTION

In accordance with one aspect of the invention there is provided a method for displaying a representation of a traffic intersection on a display of a computer. The method involves receiving operator input defining a relative orientation between a first roadway and a second roadway, the first and second roadways forming an intersection area therebetween. The method also involves receiving an operator selection of a design vehicle that is expected to use the traffic intersection, the design vehicle being defined by a plurality of design vehicle parameters. The method further involves generating at least one turning path of the design vehicle through the intersection between the first roadway and the second roadway, and generating first vehicle extent locations associated with passage of the design vehicle along the at least one turning path. The method also involves generating an outer edge of the intersection area, the outer edge being generally aligned with selected ones of the first vehicle extent locations, and generating display signals for causing the computer display to display an image representing the traffic intersection.

In accordance with another aspect of the invention there is provided an apparatus for displaying a representation of a traffic intersection on a display. The apparatus includes a processor circuit operably configured to receive operator input defining a relative orientation between a first roadway and a second roadway, the first and second roadways forming an intersection area therebetween. The processor circuit is also operably configured to receive an operator selection of a design vehicle that is expected to use the traffic intersection, the design vehicle being defined by a plurality of design vehicle parameters. The processor circuit is further operably configured to generate at least one turning path of the design vehicle through the intersection between the first roadway and the second roadway, and to generate first vehicle extent locations associated with passage of the design vehicle along the at least one turning path. The processor circuit is also operably configured to generate an outer edge of the intersection area, the outer edge being generally aligned with selected ones of the first vehicle extent locations, and to generate display signals for causing the display to display an image representing the traffic intersection.

In accordance with another aspect of the invention there is provided an apparatus for displaying a representation of a traffic intersection on a display, the method. The apparatus includes provisions for receiving operator input defining a relative orientation between a first roadway and a second roadway, the first and second roadways forming an intersection area therebetween. The apparatus also includes provisions for receiving an operator selection of a design vehicle that is expected to use the traffic intersection, the design vehicle being defined by a plurality of design vehicle parameters. The apparatus further includes provisions for generating at least one turning path of the design vehicle through the intersection between the first roadway and the second roadway, and provisions for generating first vehicle extent locations associated with passage of the design vehicle along the at least one turning path. The apparatus also includes provisions for generating an outer edge of the intersection area, the outer edge being generally aligned with selected ones of the first vehicle extent locations, and provisions for generating display signals for causing the display to display an image representing the traffic intersection.

In accordance with another aspect of the invention there is provided a computer readable medium encoded with codes for directing a processor circuit to display a representation of a traffic intersection, the codes for directing the processor circuit to receive operator input defining a relative orientation between a first roadway and a second roadway, the first and second roadways forming an intersection area therebetween. The codes also direct the processor circuit to receive an operator selection of a design vehicle that is expected to use the traffic intersection, the design vehicle being defined by a plurality of design vehicle parameters, generate at least one turning path of the design vehicle through the intersection between the first roadway and the second roadway. The codes also direct the processor circuit to generate first vehicle extent locations associated with passage of the design vehicle along the at least one turning path and to generate an outer edge of the intersection area, the outer edge being generally aligned with selected ones of the first vehicle extent locations. The codes also direct the processor circuit to generate display signals for causing the display to display an image representing the traffic intersection.

In accordance with another aspect of the invention there is provided a computer readable signal encoded with codes for directing a processor circuit to display a representation of a traffic intersection, the codes for directing the processor circuit to receive operator input defining a relative orientation between a first roadway and a second roadway, the first and second roadways forming an intersection area therebetween. The codes also direct the processor circuit to receive an operator selection of a design vehicle that is expected to use the traffic intersection, the design vehicle being defined by a plurality of design vehicle parameters, generate at least one turning path of the design vehicle through the intersection between the first roadway and the second roadway. The codes also direct the processor circuit to generate first vehicle extent locations associated with passage of the design vehicle along the at least one turning path and to generate an outer edge of the intersection area, the outer edge being generally aligned with selected ones of the first vehicle extent locations. The codes also direct the processor circuit to generate display signals for causing the display to display an image representing the traffic intersection.

In accordance with another aspect of the invention there is provided a method for displaying a representation of a traffic roundabout on a display of a computer, the roundabout having a central island surrounded by a circulatory lane. The method involves receiving an operator selection of a design vehicle that is expected to use the roundabout, the design vehicle being defined by a plurality of design vehicle parameters. The method also involves receiving operator input of a design dimension for the roundabout, the design dimension defining a size of one of the central island, and an outer perimeter of the circulatory lane. The method further involves generating a circulatory path of the design vehicle traveling within the design dimension along the circulatory lane, and generating vehicle extent locations associated with passage of the design vehicle along the circulatory path. The method also involves using the vehicle extent locations to compute a circulatory lane width, and generating display signals for causing the display to display an image representing the roundabout.

In accordance with another aspect of the invention there is provided an apparatus for displaying a representation of a traffic roundabout on a display, the roundabout having a central island surrounded by a circulatory lane. The apparatus includes a processor circuit operably configured to receive an operator selection of a design vehicle that is expected to use the roundabout, the design vehicle being defined by a plurality of design vehicle parameters. The processor circuit is also operably configured to receive operator input of a design dimension for the roundabout, the design dimension defining a size of one of the central island, and an outer perimeter of the circulatory lane. The processor circuit is further operably configured to generate a circulatory path of the design vehicle traveling within the design dimension along the circulatory lane, and to generate vehicle extent locations associated with passage of the design vehicle along the circulatory path. The processor circuit is also operably configured to use the vehicle extent locations to compute a circulatory lane width, and to generate display signals for causing the display to display an image representing the roundabout.

In accordance with another aspect of the invention there is provided an apparatus for displaying a representation of a traffic roundabout on a display of a computer, the roundabout having a central island surrounded by a circulatory lane. The apparatus includes provisions for receiving an operator selection of a design vehicle that is expected to use the roundabout, the design vehicle being defined by a plurality of design vehicle parameters. The apparatus also includes provisions for receiving operator input of a design dimension for the roundabout, the design dimension defining a size of one of the central island, and an outer perimeter of the circulatory lane. The apparatus further includes provisions for generating a circulatory path of the design vehicle traveling within the design dimension along the circulatory lane, and provisions for generating vehicle extent locations associated with passage of the design vehicle along the circulatory path. The apparatus also includes provisions for computing a circulatory lane width using the vehicle extent locations, and provisions for generating display signals for causing the display to display an image representing the roundabout.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention,

FIG. 5 is a side view of a plurality of exemplary design vehicles;

FIG. 6 is a table of design vehicle parameters for the design vehicles shown in FIG. 5;

DETAILED DESCRIPTION

Figure 1:
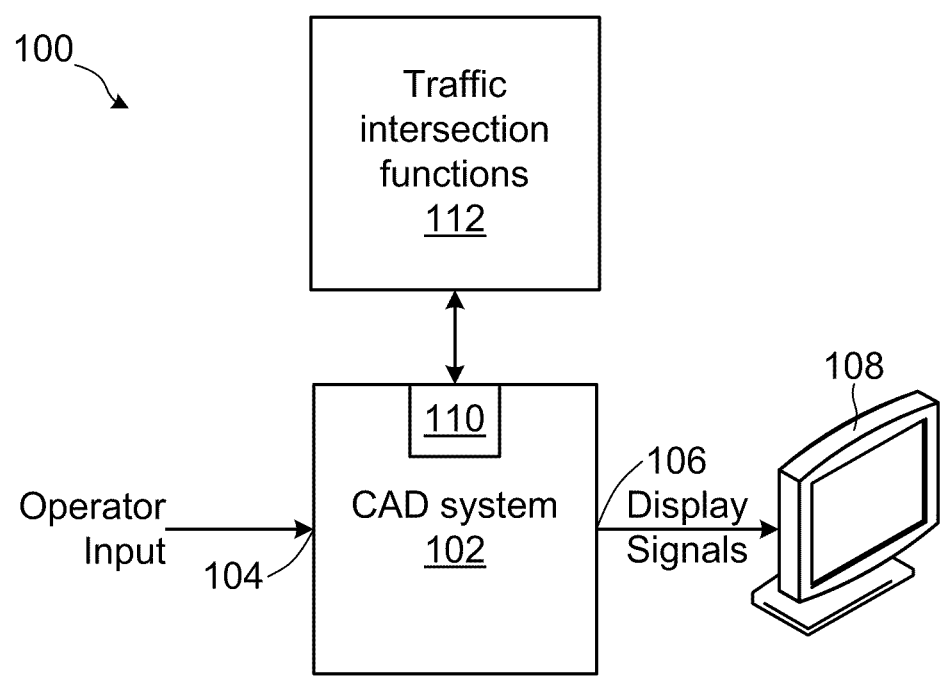
FIG. 1 is a block diagram of an apparatus for displaying a representation of a traffic intersection.

Referring to FIG. 1, a block diagram of an apparatus for displaying a representation of a traffic intersection is shown generally at 100. The apparatus 100 includes a CAD system 102 having an input 104 for receiving operator input and an output 106 for producing display signals. In the embodiment shown, the apparatus 100 also includes a display 108 for displaying an image representing the traffic intersection in response to receiving the display signals. The CAD system 102 includes an interface 110 that provides access to the CAD system functions implemented by the CAD system 102.

The apparatus also includes a traffic intersection functional block 112, which provides functions for causing the CAD system 102 to produce the display signals representing the traffic intersection. The intersection functional block 112 interfaces with the CAD system through the interface 110.

The CAD system may be provided by causing a computer to execute CAD system software such as the AutoCAD® software application available from Autodesk Inc. of San Rafael, Calif., USA. AutoCAD provides drawing elements such as lines, polylines, circles, arcs, and other complex elements. Customization of AutoCAD is provided through ObjectARX (AutoCAD Runtime Extension), which is an application programming interface (API) that permits access to a class-based model of AutoCAD drawing elements. Customization code may be written in a programming language such as $C^{++}$, which may be compiled to provide the functionality represented as the roundabout functional block 112.

Other CAD systems, such as MicroStation sold by Bentley Systems Inc. of Exton, Pa., USA, provide similar CAD functionality and interfaces for customization. Advantageously, using existing CAD software applications to provide standard CAD functionality allows operators to produce drawing files representing the traffic intersection using a familiar software application. The resulting drawing files may also be saved in such a manner to permit other operators who do not have access to the traffic intersection functional block 112, to view and/or edit the drawings.

Processor Circuit

Figure 2:
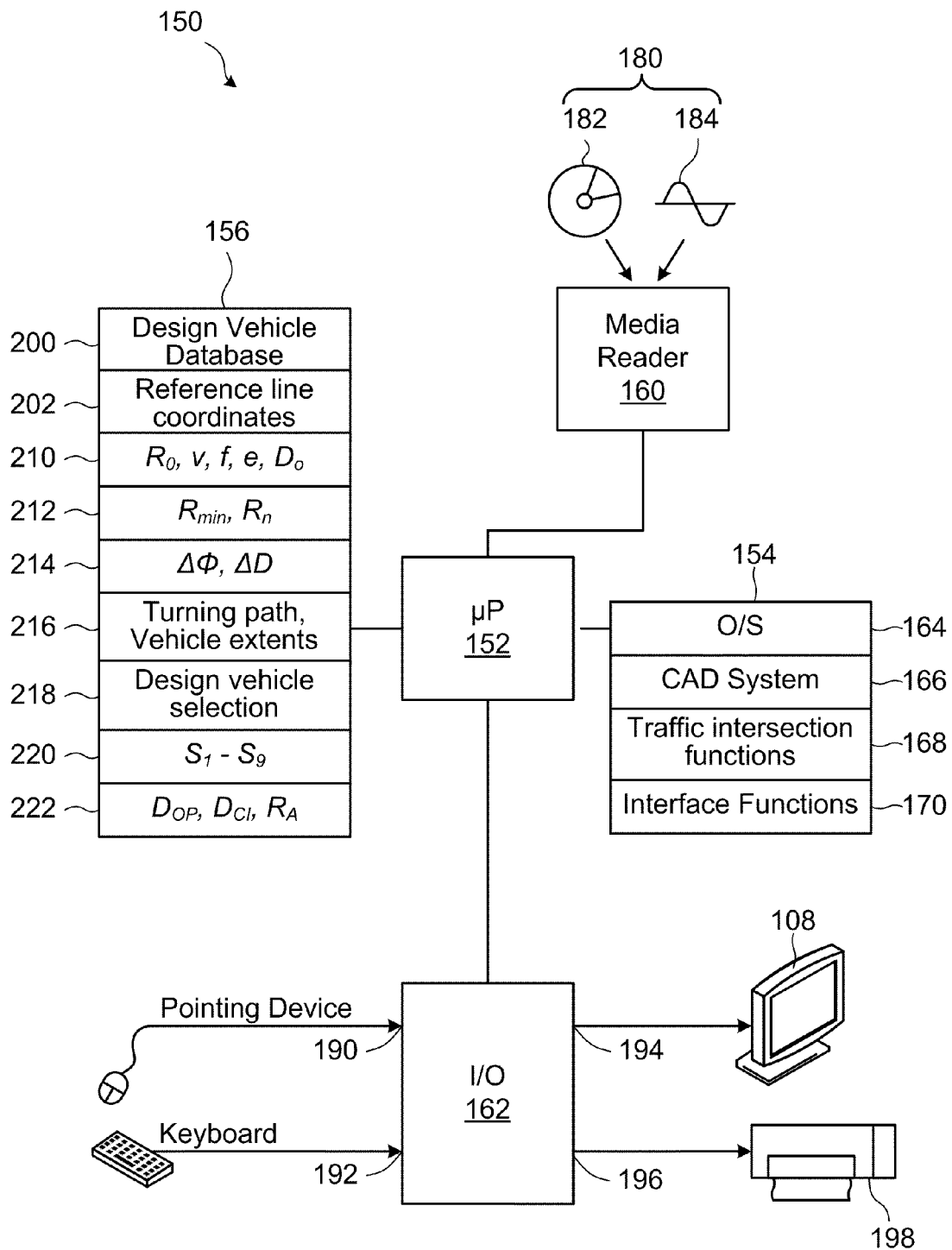
FIG. 2 is a schematic view of a processor circuit for implementing the apparatus shown in FIG. 1.

Referring to FIG. 2, a processor circuit for implementing the apparatus 100 (shown in FIG. 1) is shown generally at 150.

The processor circuit 150 includes a microprocessor 152, a program memory 154, a variable memory 156, a media reader 160, and an input output port (I/O) 162, all of which are in communication with the microprocessor 152.

Program codes for directing the microprocessor 152 to carry out various functions are stored in the program memory 154, which may be implemented as a random access memory (RAM) and/or a hard disk drive (HDD), or a combination thereof. The program memory 154 includes a first block of program codes 164 for directing the microprocessor 152 to perform operating system functions and a second block of program codes 166 for directing the microprocessor 152 to perform CAD system functions for implementing the CAD system 102 shown in FIG. 1. The program memory 154 also includes a third block of program codes 168 for directing the microprocessor 152 to perform traffic intersection representation functions and a fourth block of program codes 170 for directing the microprocessor 152 to provide an interface between the CAD functions and the traffic intersection representation functions.

The media reader 160 facilitates loading program codes into the program memory 154 from a computer readable medium 180, such as a CD ROM disk 182, or a computer readable signal 184, such as may be received over a network such as the internet, for example.

The I/O 162 includes a first input 190 for receiving operator input signals from a pointing device 191. The pointing device may be a computer mouse, trackball, or digitizing tablet, or other device operable to produce pointer movement signals. The I/O 162 also includes a second input 192 for receiving operator input signals from a character input device, such as a keyboard 193. The I/O 162 further includes a first output 194 for producing display signals for driving the display 108. In the embodiment shown in FIG. 2, a plotter 198 is also provided for producing a hardcopy of the traffic intersection representation and the I/O 162 further includes a second output 196 for producing signals for controlling the plotter 198. The plotter 198 may be a large format plotter for printing a plan of the traffic intersection.

The variable memory 156 includes a plurality of storage locations including a database store 200 for storing design vehicle parameters, and a store 202 for storing reference line coordinates. The variable memory 156 also includes stores 210, 212, and 214 for storing various values and parameters used in generating a representation of an intersection as described later herein. The variable memory 156 further includes a store 216 for storing a turning path, and for storing vehicle extent locations and a store 218 for storing design vehicle selections. The variable memory 156 also includes a store 220 for storing a plurality of offsets and a store 222 for storing various values and parameters associated with generating a representation of a traffic roundabout as described later herein. The variable memory 156 may be implemented as a hard drive, for example.

Traffic Intersection

Figure 3:
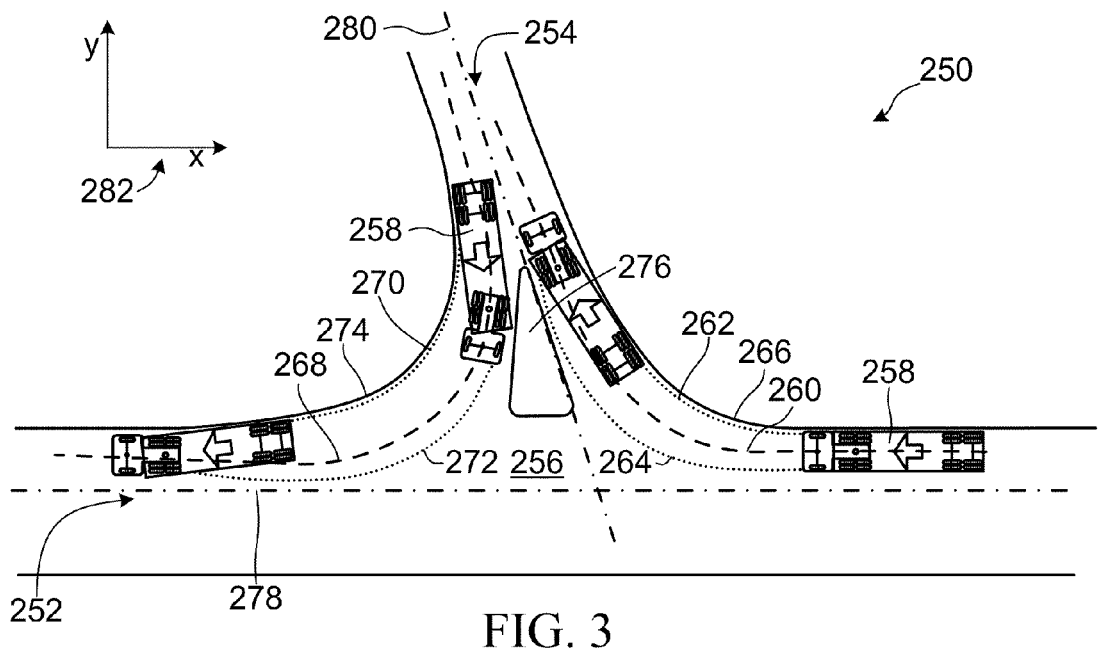
FIG. 3 is a plan view of an exemplary at grade traffic intersection representation.

An exemplary representation of an at grade traffic intersection is shown generally at 250 in FIG. 3. In general the CAD system 102 provides functions for displaying the lines, curves and other elements that make up the intersection representation 250. In the embodiment shown, each element of the intersection representation 250 is defined using two-dimensional (x,y) coordinates in a Cartesian coordinate system as indicated by coordinate axes x, and y shown at 282.

Figure 4:
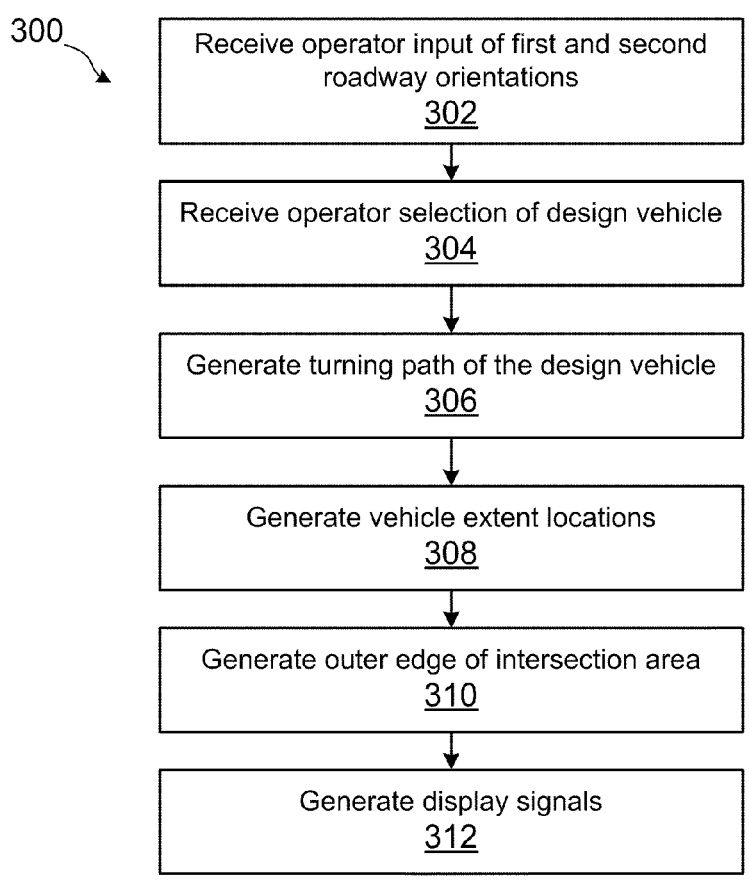
FIG. 4 is a block diagram of a process executed by the processor circuit shown in FIG. 2 for generating the intersection representation shown in FIG. 3.

Referring to FIG. 4, a flowchart depicting blocks of code for directing the processor circuit 150 to display the traffic intersection representation 250 is shown generally at 300. The process begins at block 302, which directs the microprocessor 152 to receive operator input at the inputs 190 and 192 of the I/O 162 defining a relative orientation between a first roadway 252 and a second roadway 254. The first and second roadways 252 and 254 are oriented to form an intersection area 256 therebetween.

Block 304 then directs the microprocessor 152 to receive an operator selection of a design vehicle 258, which is expected to use the traffic intersection. The design vehicle 258 is defined by a plurality of design vehicle parameters stored in the design vehicle database 200 (shown in FIG. 2).

The process then continues at block 306, which directs the microprocessor 152 to generate at least one turning path 260 of the design vehicle through the intersection between the first roadway 252 and the second roadway 254. Block 308 then directs the microprocessor 152 to generate first vehicle extent locations 262 and 264 associated with passage of the design vehicle 258 along the turning path 260. In the embodiment shown in FIG. 3, the turning path 260 is a centerline path along which the design vehicle 258 travels.

Block 310 then directs the microprocessor 152 to generate an outer edge 266 of the intersection area 256, the outer edge being generally aligned with the vehicle extent locations 262.

The process then continues at block 312, which directs the microprocessor 152 to generate display signals at the output 194 (shown in FIG. 1) for causing the display 108 to display an image representing the traffic intersection, such as the representation 250 shown in FIG. 3.

Blocks 306-312 may then be repeated to generate a second turning path 268 of the design vehicle 258 from the second roadway 254 to the first roadway 252 and to generate vehicle extent locations 270 and 272, which are then used to define a second outer edge 274 of the intersection area 256.

The design vehicle 258 will generally be a vehicle of a larger size, such as the articulated design vehicle shown in FIG. 1. In general, the selected design vehicle will be able to travel through the displayed intersection without encroaching on the outer edges 266 or 274 or other portions of the intersection lying outside the intersection area 256. Even larger vehicles than the design vehicle 258 may still be able to travel through the intersection by encroaching on the outer edges 266 or 274 or a splitter island 276 located in the intersection area 256.

The orientation of the first roadway 252 is defined by a first reference line 278 and the orientation of the second roadway 254 is defined by a second reference line 280. The first and second reference lines 278 and 280 are defined in the Cartesian coordinate system 282, and receiving the operator input defining the relative orientation between the first roadway and the second roadway involves receiving operator input of data defining the first and second reference lines 278 and 280 at the inputs 190 and 192 of the I/O 162. The data defining the reference lines 278 and 280 may include coordinates of endpoints of the reference lines 278 and 280, for example. The coordinates are stored in the reference line coordinates store 202 shown in FIG. 2.

Design Vehicle

Referring to FIG. 5, side view representations of exemplary design vehicles are shown at 320, 322, and 324 respectively. The design vehicle 320 is a WB40 standard bus, the design vehicle 322 is a WB-50 semi-trailer, and the design vehicle 324 is a standard passenger car. The vehicles 320, 322, and 324 are taken from the American Association of State Highway and Transportation Officials (AASHTO) library of standard design vehicles.

Each of the design vehicles 320, 322, and 324 are defined by a plurality of design vehicle parameters stored in the database 200 (shown in FIG. 2). Referring to FIG. 6, a table listing exemplary parameters for the design vehicles 320-324 is shown generally at 340. The parameter listing 340 includes a steering lock angle parameter 342 representing an angle through which the steering of the vehicle is capable of turning from a straight ahead condition. The parameter listing 340 also includes dimensions for overall vehicle length 344, front overhang 346, body width 348, and wheelbase 350. The front overhang dimension 346 is taken from the center of the front wheel to the front extent of the vehicle and the wheelbase is the dimension between front and rear axles of the vehicle. For the WB-50 design vehicle 322 the wheelbase dimension 350 is taken between the center of the front wheel and the center of a rear axle group, which includes two spaced apart axles each having 4 wheels.

The parameter listing 340 also includes parameters associated with a front axle group, including the number of wheels per axle 354 and a track dimension 352. In this embodiment, the track dimension 352 is the distance between outer edges of the tire tread measured across the axle. Conventionally, track dimensions generally refer to a distance between respective centers of the outer wheel tire tread, but for intersection design the outside of the tire tread is relevant for defining intersection features. Accordingly, when populating the design vehicle database 200, the conventional track dimensions are adjusted to correspond to the distance between the outer edges of the tire tread measured across the axle.

The parameter listing 340 also includes parameters associated with a rear axle group, including the number of wheels per axle 358 and a track dimension 356. The parameter listing 340 further includes a number of parts parameter 360, which when set to "1" indicates that the vehicle is an unarticulated vehicle, and for values of "2" or higher indicates that the vehicle articulated. The vehicle 322 is articulated and includes a tractor portion 326 and a trailer portion 328 connected to the tractor portion at a pivot location 330. The parameter listing also includes a pivot location dimension 362, which is referenced to the center of the rear axle group of the tractor 326.

The parameter listing 340 also includes trailer parameters, such as a trailer length parameter 364 and an articulating angle parameter 366. The articulating angle parameter 366 represents is a maximum angle that may exist between a longitudinal centerline of a tractor portion 326 and a longitudinal centerline of a trailer portion 328 when turning the vehicle.

The database 200 (shown in FIG. 2) stores sets of parameters 340 for a plurality of design vehicles, such as the vehicles 320 to 324 shown in FIG. 5, and facilitates selection of such vehicles for producing the representation of the traffic roundabout. For example, Libraries of various standard design vehicles are implemented in the AutoTURN® software product available from Transoft Solutions Inc. of British Columbia, Canada. The libraries include commonly used design vehicles for different countries and also provide for custom definition of vehicles not available in the standard libraries.

Figure 7:
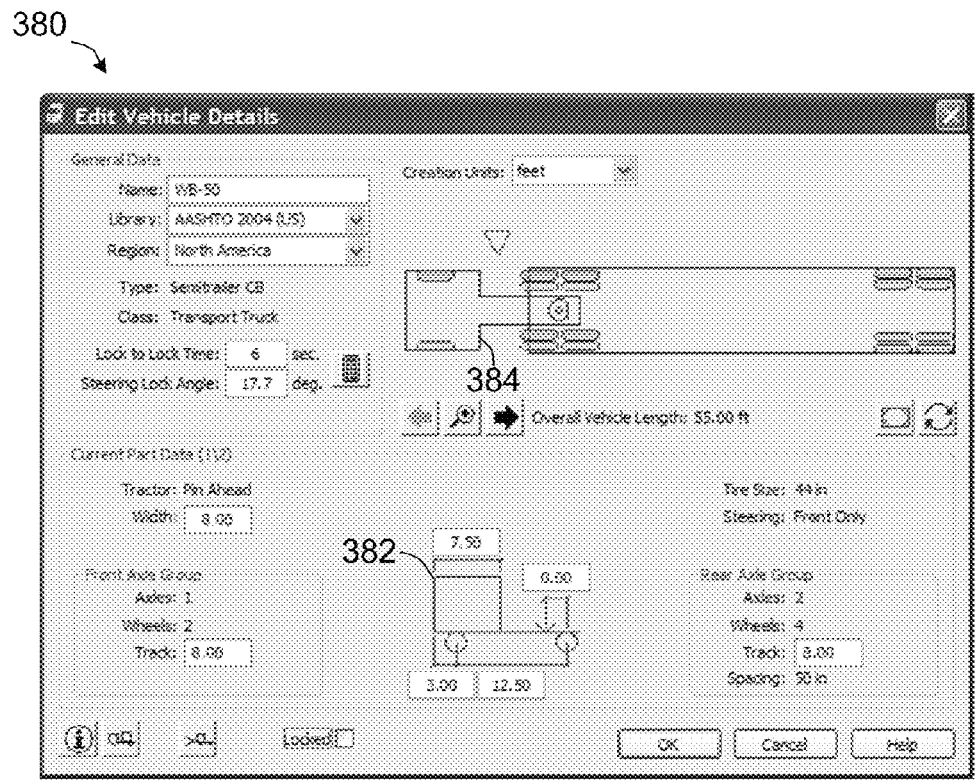
FIG. 7 is a screenshot of an operator interface for entering or editing design vehicle parameters displayed by the processor circuit shown in FIG. 2.

Referring to FIG. 7, an operator interface displayed by AutoTURN for entering or editing design vehicle parameters stored in the database 200 is shown generally at 280. In this embodiment, the vehicle is represented by generally simple box shapes 382 and 384 and the operator inputs various dimensions for the design vehicle in the fields provided. In other embodiments, more realistic design vehicles may be provided by modifying the box shapes 382 and 384 to more accurately represent the actual vehicle shape.

Bicycle Model

In this embodiment, when generating the turning path at block 306 of FIG. 4, the design vehicle is represented by a bicycle model. The use of a bicycle model simplifies computation of coordinate locations along the turning path, thereby providing improved computational efficiency.

Figure 8:
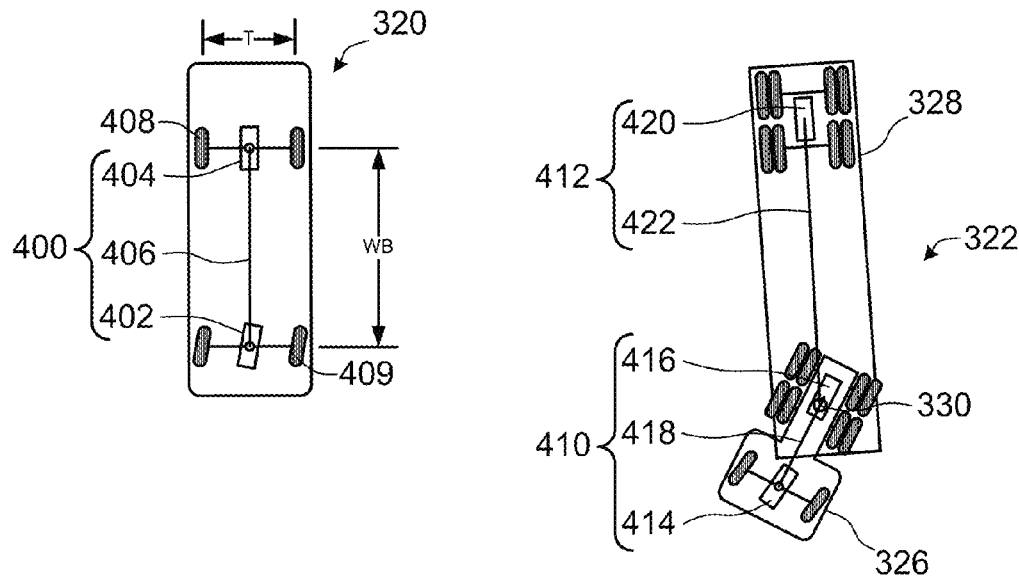
FIG. 8 is a top view of two of the exemplary design vehicles shown in FIG. 5.

Referring to FIG. 8, a bicycle model 400 for the design vehicle 320 includes a front wheel 402 and a rear wheel 404, which are separated by a distance 406 corresponding to a wheelbase dimension of the design vehicle 320. The front and rear wheels 402 and 404 are centered between the respective front and rear wheels of the design vehicle 320 (i.e. the front and rear wheels are each located at half of the respective track dimensions 352 and 356 shown in FIG. 6). In the embodiment shown, the front wheels of the design vehicle 320 are steerable and the corresponding front wheel 402 of the bicycle model 400 is also steerable while the rear wheel 404 of the bicycle model is fixed. In other embodiments the design vehicle 320 may have steerable rear wheels, in place of or in addition to steerable front wheels, and the bicycle model 400 may thus include a corresponding steerable rear wheel 404 or steerable front and rear wheels.

For any arbitrary location of the bicycle model 400, the design vehicle parameters stored in the design vehicle database 200 may be used to determine corresponding locations of the wheels of the design vehicle. For example, the front left hand wheel 409 of the design vehicle 320 is spaced apart from the front wheel 402 of the bicycle model by half of the track width dimension 352 in a direction perpendicular to the wheelbase 406. Locations of other vehicle extents, such as the right hand rear wheel 408, may be similarly computed using the design vehicle parameters.

For more complex design vehicles such as the design vehicle 322 shown in FIG. 8, a representative bicycle model 410 may be generated that includes a bicycle model portion 410 for the tractor portion 326 of the design vehicle and a bicycle model portion 412 for the trailer portion 328 of the design vehicle. The bicycle model portion 412 includes front and rear wheels 414 and 416 separated by a distance 418 corresponding to a wheelbase dimension of the tractor 326. The bicycle model portion 412 includes a fixed rear wheel 420, which is separated by a distance 422 from the pivot 330. The distance 422 corresponds to a wheelbase dimension of the trailer portion 328 of the design vehicle 322. In other embodiments the rear wheel 420 may also be steerable to correspond to an articulated vehicle having rear wheels of the trailer portion 328 coupled to a steering mechanism to facilitate improved steerability of the articulated vehicle.

Turning Path and Vehicle Extents

Figure 9A:
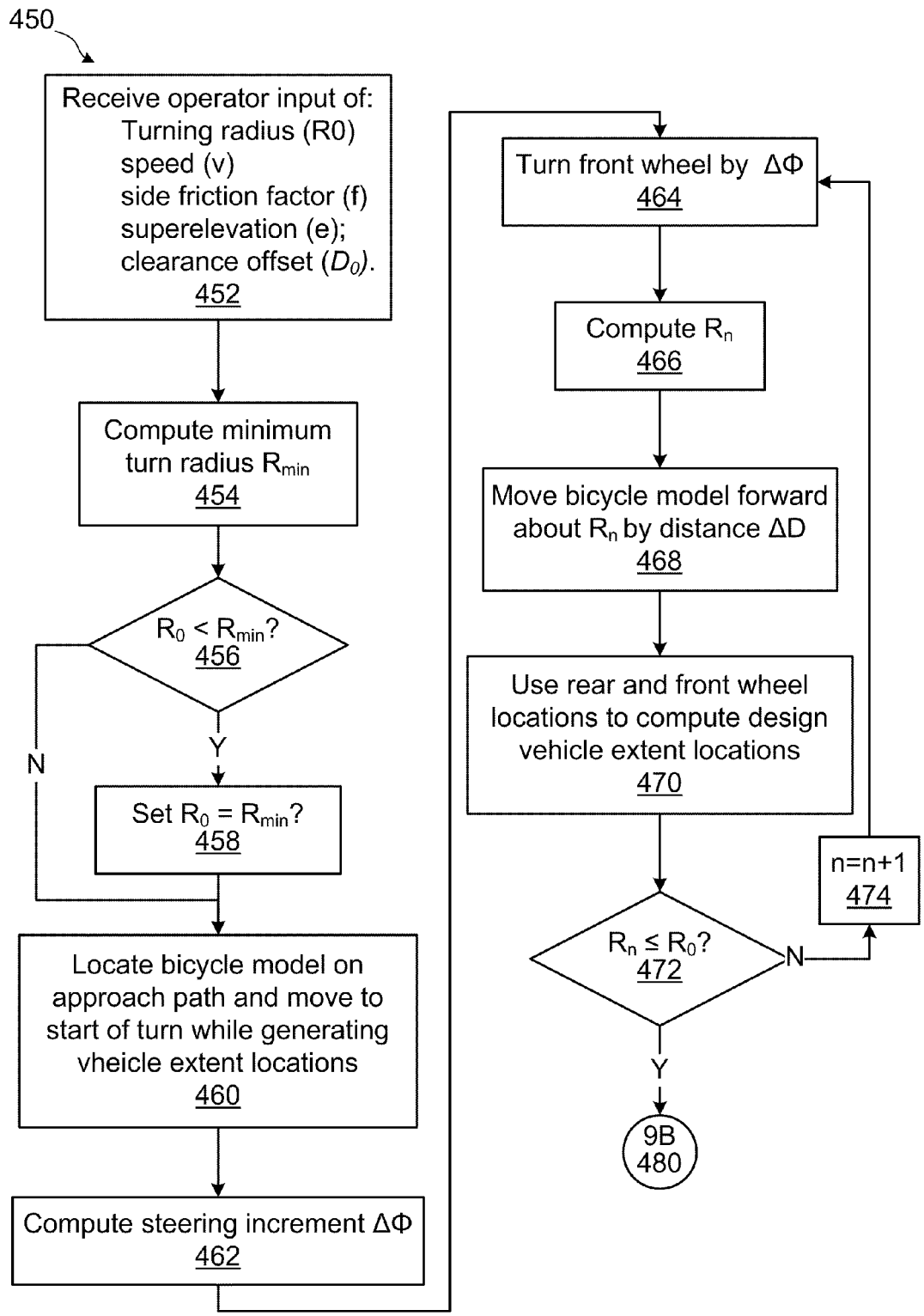
FIG. 9 is a block diagram of a process executed by the processor circuit shown in FIG. 2 for generating a turning path and vehicle extent locations of a design vehicle.
Figure 9B:
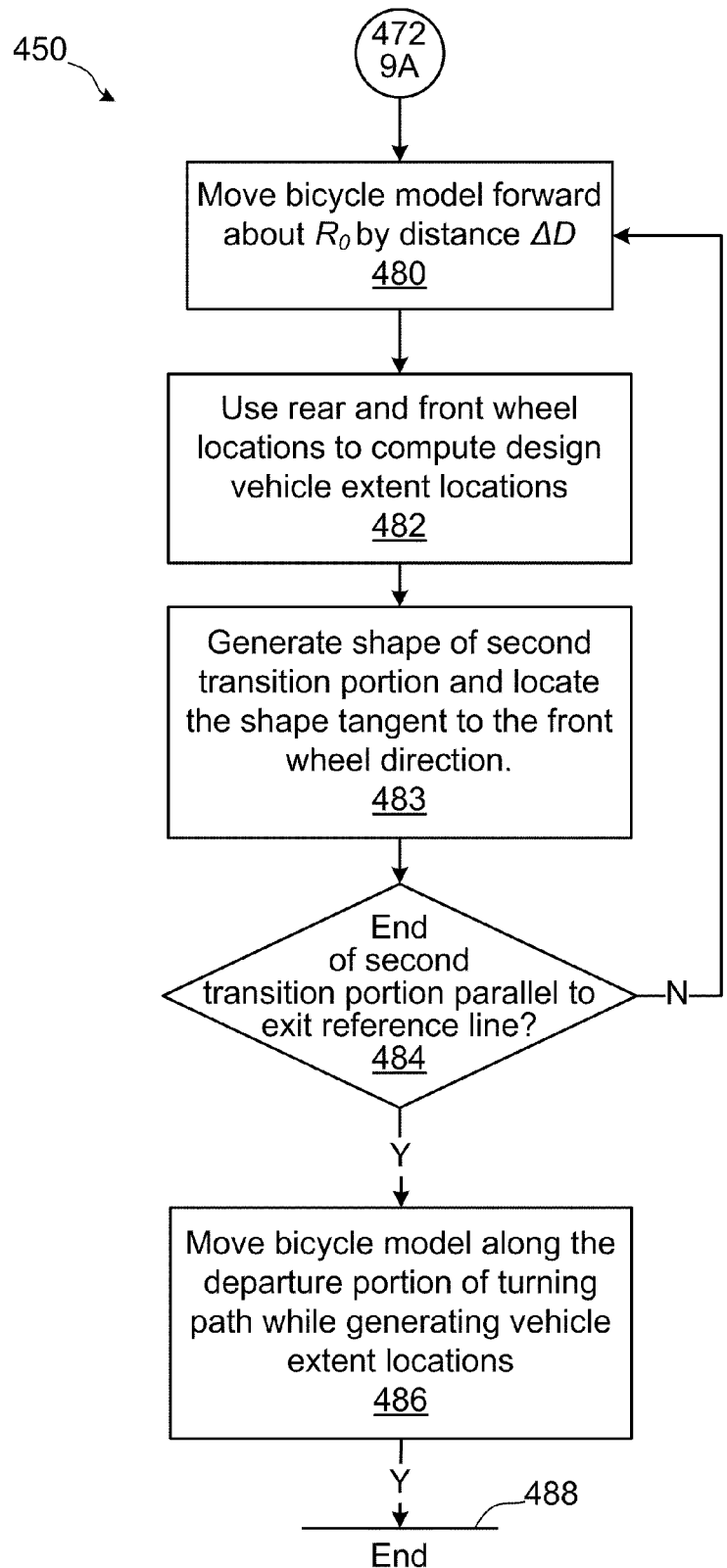

A flowchart depicting blocks of code for directing the processor circuit 150 to implement a process for generating the turning path and vehicle extent locations of the design vehicle (bocks 306 and 307 of FIG. 4) is shown at 450 in FIG. 9A and FIG. 9B.

Referring to FIG. 9A, the process begins at block 452, which directs the microprocessor 152 to receive operator input of a plurality of parameters for generating the turning path, including a turning radius $R_0$, a speed v of the design vehicle through the turn, a side friction factor f associated with a surface of the first and second roadways 252 and 254, a superelevation parameter e defining the cross-slope of the roadway, and a clearance allowance offset value $D_0$. The superelevation e is expressed as a percentage value and when e is positive the superelevation defines a slope that assists the design vehicle in completing the turn, while negative values of e define a slope that make completion of the turn more difficult for the design vehicle. The parameters R, v, f, e, and $D_0$ are stored in the store 210 of the variable memory 156.

Block 454 then directs the microprocessor 152 to compute a minimum turn radius $R_{min}$. In this embodiment the minimum turn radius is computed in accordance with the formula:

$$R_{min} = \frac{v^2}{127\left(\frac{e}{100} + f\right)} \quad \text{Eqn 1}$$

where:
$R_{min}$ is the minimum turn radius in meters;
v is the speed of the design vehicle in kilometers per hour;
e is the superelevation; and
f is a side friction factor.

The radius $R_{min}$ is computed using the values stored in the store 210 of the variable memory 156 and the computed $R_{min}$ value is stored in the store 212.

Note that for units other than meters and kilometers, the values of the numerical constants in Eqn 1 would have to be modified accordingly.

Block 456 then directs the microprocessor 152 to determine whether the turn radius $R_0$ input by the operator is less then the minimum turn radius $R_{min}$, in which case block 458 directs the microprocessor 152 to write the value of $R_{min}$ into the store 210 as the turning radius $R_0$. In other embodiments block 458 may direct the microprocessor 152 to generate a warning signal for displaying a warning to inform the operator that the selected turn radius is not a feasible turn radius. For example, the warning signal may cause an audible tone to be generated and/or causing an operator interface to be displayed to alert the operator. If at block 456 the turn radius $R_0$ input by the operator is not less then the minimum turn radius $R_{min}$ the process continues at block 460.

Figure 10:
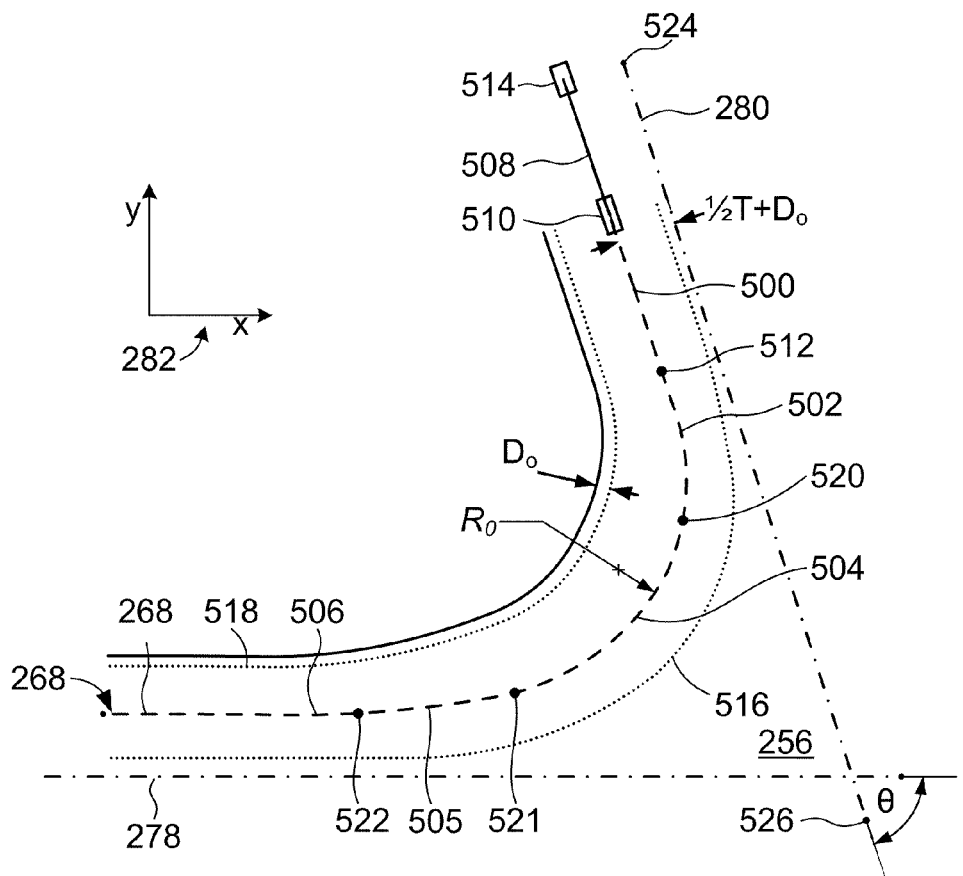
FIG. 10 is a more detailed plan view of the intersection shown in FIG. 3.

The turning path 268 (shown in FIG. 3) is shown in greater detail in FIG. 10. Referring to FIG. 10, the turning path 268 includes an approach portion 500, a first transition portion 502, a circular arc turning portion 504, a second transition portion 505, and a departure portion 506. The approach portion 500 is aligned with the second reference line 280 and the departure portion 506 is aligned with the first reference line 278. The first reference line 278 and second reference line 280 are oriented at an angle θ to each other. The angle θ is set by the operator at block 302 of FIG. 4 when input of the roadway orientations is received. In this embodiment the reference lines 278 and 280 are straight lines, but in other embodiments the reference lines may be curved and the approach and departure portions 500 and 506 may have corresponding curvatures that correspond to the reference line curvature.

Block 460 then directs the microprocessor 152 to locate a bicycle model 508 of the design vehicle on the approach path and then to move the bicycle model along the approach path by successive increments of ΔD until a front wheel 510 of the bicycle model is at a start 512 of the first transition portion 502. In this embodiment, the approach portion 500 is spaced inwardly from the second reference line 280 by a distance corresponding to half of the front axle track the design vehicle, and a further offset $D_o$ is added to provide a clearance allowance for the vehicle traveling through the intersection. The bicycle model 508 represents the design vehicle, which in this example is an unarticulated vehicle such as the bus-40 vehicle 320 shown in FIG. 8.

Block 460 also directs the microprocessor 152 to compute vehicle extent locations at each location along the approach portion 500. Referring back to FIG. 8, for the turn shown in FIG. 10, the vehicle extents are defined by the right hand rear wheel 408 and the left hand front wheel 409. Selection of these wheels as defining the vehicle extents is based on the assumption that while the wheel 408 should clear any curb, other vehicle features that may protrude beyond the wheels are located at a sufficient height to pass above the curb. Should the curb be higher than usual, or any other vehicle features be located at a height which would cause it to encroach on the curb, such features may be selected as vehicle extents in preference to the right hand rear wheel 408 and the left hand front wheel 409. Referring back to FIG. 9A, block 460 also directs the microprocessor 152 to write coordinate values of locations of the front and rear wheels 510 and 514 along the approach portion 500 and coordinates of the corresponding vehicle extents of the design vehicle to the store 216 of the variable memory 156.

Referring back to FIG. 10, the vehicle extent locations for the left hand front wheel 409 are shown at 516 and the vehicle extent locations for the right hand rear wheel 408 are shown at 518. The vehicle extent locations 516 and 518 each include a successive plurality of coordinate locations spaced apart by a distance ΔD.

The first transition portion 502 of the turning path 268 represents a portion of the turn during which a driver of the design vehicle is turning the steering to cause the vehicle to begin steering through the turn. In this embodiment, the first transition portion 502 has a generally spiral shape having reducing radius as the bicycle model 508 moves along the first transition portion.

Block 462 then directs the microprocessor 152 to compute a steering increment Δϕ. In this embodiment the steering increment is computed in accordance with the following formulae:

$$SR = \frac{2\phi_{LA}}{t_L} \qquad \text{Eqn 2}$$

where:
SR is the steering rate in degrees/second;
$\phi_{LA}$ is the steering lock angle; and
$t_L$ is the time for an average driver to steer from a left hand steering lock condition to a right hand steering lock condition or vice versa.

The value of $t_L$ may be measured for each design vehicle under driving conditions, or a default value (such as 6 seconds) may be assumed for the design vehicle.

The steering increment is then computed from:

$$\Delta\phi = SR\frac{\Delta D}{v} \qquad \text{Eqn 3}$$

where:
ΔD is the distance increment;
v is the speed of the design vehicle through the turn; and
Δϕ is the steering increment per distance increment.

In one embodiment the distance increment ΔD is set to 4 inches. The value of the steering increment Δϕ is then written to the store 214 of the variable memory 156.

Figure 11:
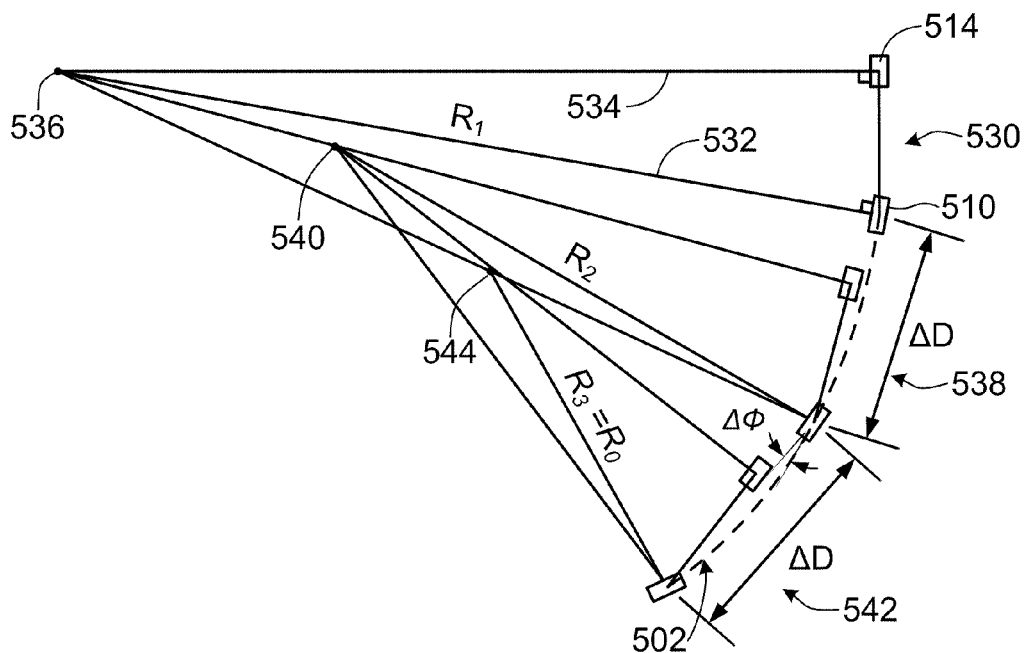
FIG. 11 is a schematic view of a transition portion of a turning path of the intersection shown in FIG. 10.

Block 464 then directs the microprocessor 152 to read the value of LW from the store 214 and to turn the front wheel of the bicycle model by an angle corresponding to Δϕ. The first transition portion 502 of the turning path 268 is shown in greater detail in FIG. 11. Referring to FIG. 11, the bicycle model 508 is shown in a first location 530, with the front wheel 510 having been turned through the angle Δϕ while a rear wheel 514 remains stationary.

Block 466 then directs the microprocessor 152 to compute a value of an instantaneous turn radius $R_n$ (where n=1, 2, 3 ... ). Computing the first radius $R_1$ involves determining an intersection between lines 532 and 534, which each extend perpendicularly outward from the respective front and rear wheels 510 and 514 in accordance with the formula:

$$R_n = \frac{WB}{\sin n\Delta\phi} \qquad \text{Eqn 4}$$

where n=1 for calculating the radius $R_1$ at the first location 530, and WB is the wheelbase of the design vehicle is read from the design vehicle database 200 (shown in FIG. 2).

The Radius $R_1$ defines a center of rotation 536 for a first movement of the bicycle model 508 along the first transition portion 502 from the first location 530. Block 468 then directs the microprocessor 152 to read the value of ΔD from the store 214 of the variable memory 156 and to move the bicycle model through an arc about the center of rotation 534 to a second location 538, such that the front wheel 510 is displaced by a distance ΔD from the first location.

Block 470 then directs the microprocessor 152 to use the locations of the front and rear wheels 510 and 514 of the bicycle model to compute corresponding vehicle extent locations for the design vehicle using the values of design vehicle parameters for the design vehicle read from the design vehicle database 200. The vehicle extent locations are shown at 516 and 518 in FIG. 10. Block 470 also directs the microprocessor 152 to write coordinate values of locations of the front and rear wheels 510 and 514 along the first transition portion 502 and coordinates of the corresponding vehicle extents of the design vehicle to the store 216 of the variable memory 156.

The process then continues at block 472, which directs the microprocessor 152 to read the value of $R_O$ (the operator defined turn radius) and to determine whether $R_n$ is less than or equal to $R_o$. If $R_n$ is still greater than $R_o$, block 472 directs the microprocessor 152 to block 474, where n is incremented. Block 474 then directs the microprocessor 152 back to block 464 and the blocks 464 to 472 of the process 450 are repeated. At the repeat of block 464, the front wheel 510 is turned through a further angle Δϕ, and the radius $R_2$ is computed using Eqn 4 with n=2. The radius $R_2$ defines a new center of rotation 540 for moving the bicycle model 508 from the second location 538 to a third location 542.

It should be noted that in FIG. 11, the spacing ΔD is exaggerated for sake of clarity. In practice, as mentioned above, ΔD may be a small increment of about 4 inches thus producing a large plurality of locations along the turning path 268 and the vehicle extents 516 and 518.

If at block 472, the radius $R_n$ matches the radius $R_o$ specified by the operator (as is the case for $R_3$), the first transition portion 502 of the turning path 268 is completed and the circular arc turning portion commences at a point 520. Once the circular arc portion 504 is reached, the steering angle of the front wheel 510 is held constant. Referring to FIG. 9B, block 480 then directs the microprocessor 152 to move the bicycle model 508 forward about the rotational center 544 by successive increments of ΔD. Bock 482 then directs the microprocessor 152 to use the locations of the front and rear wheels 510 and 414 of the bicycle model to compute corresponding vehicle extent locations for the design vehicle. Block 482 also directs the microprocessor 152 to write coordinate values of locations of the front and rear wheels 510 and 514 and coordinates of the corresponding vehicle extents of the design vehicle to the store 216 of the variable memory 156.

Block 483 then directs the microprocessor 152 to generate a mirrored shape of the second transition portion 502 for generating a second transition portion curve shape. Mirror functions for shapes are generally provided in CAD systems such as the CAD system 102 shown in FIG. 1, and may be applied to produce a target shape that is a mirror image of an input shape. The mirrored shape is then positioned so that a first end of the mirrored curve (corresponding to the point 520 on the first transition portion) is located tangent to the front wheel 510.

The process then continues at block 484, which directs the microprocessor 152 to determine whether a second end of the shape of the second transition portion is parallel to the reference line 278. If the second end is not parallel to the reference line 278 then block 484 directs the microprocessor 152 back to block 480, and blocks 480 to 484 are repeated.

If at block 484, the second end of the second transition portion is parallel to the reference line 278 then the circular arc portion 504 of the turning path 268 is completed at a point 521, and the mirrored shape is correctly positioned and forms the second transition curve 505. The second transition curve 505 extends between the points 521 and 522, and represents a portion of the turn during which a driver of the design vehicle is turning the steering to cause the vehicle to begin steering out of the turn. In this embodiment, the second transition portion 505 has a generally spiral shape having increasing radius as the bicycle model 508 moves along the second transition portion.

Block 486 then directs the microprocessor 152 to move the bicycle model along the second transition portion 506 and the departure portion 506 by successive increments of ΔD and to compute vehicle extent locations at each location along the turning path 268. At each successive increment the steering angle ϕ is decremented by Δϕ, where Δϕ is an angle between the current steering angle of the front wheel of the bicycle model 510 and a line drawn tangent to the turning path 268 at each successive location. The front wheel of the bicycle model 508 is then moved to the next successive location located ΔD along the turning path 268. At each successive location, bock 486 also directs the microprocessor 152 to use the locations of the front and rear wheels 510 and 414 of the bicycle model to compute corresponding vehicle extent locations for the design vehicle. Block 486 further directs the microprocessor 152 to write coordinate values of locations of the front and rear wheels 510 and 514 along the second transition portion 505 and the departure portion 506 and coordinate values of the corresponding vehicle extents of the design vehicle to the store 216 of the variable memory 156. The process 450 then ends at 488.

In other embodiments, the first and/or second transition portions (502, 505) of the turning path 268 may be omitted, thus representing the turning path using only the approach portion 500, the circular arc turning portion 504 specified by the operator input radius $R_O$, and the departure portion 506.

Generating the Outer Edges of the Intersection

Figure 12:
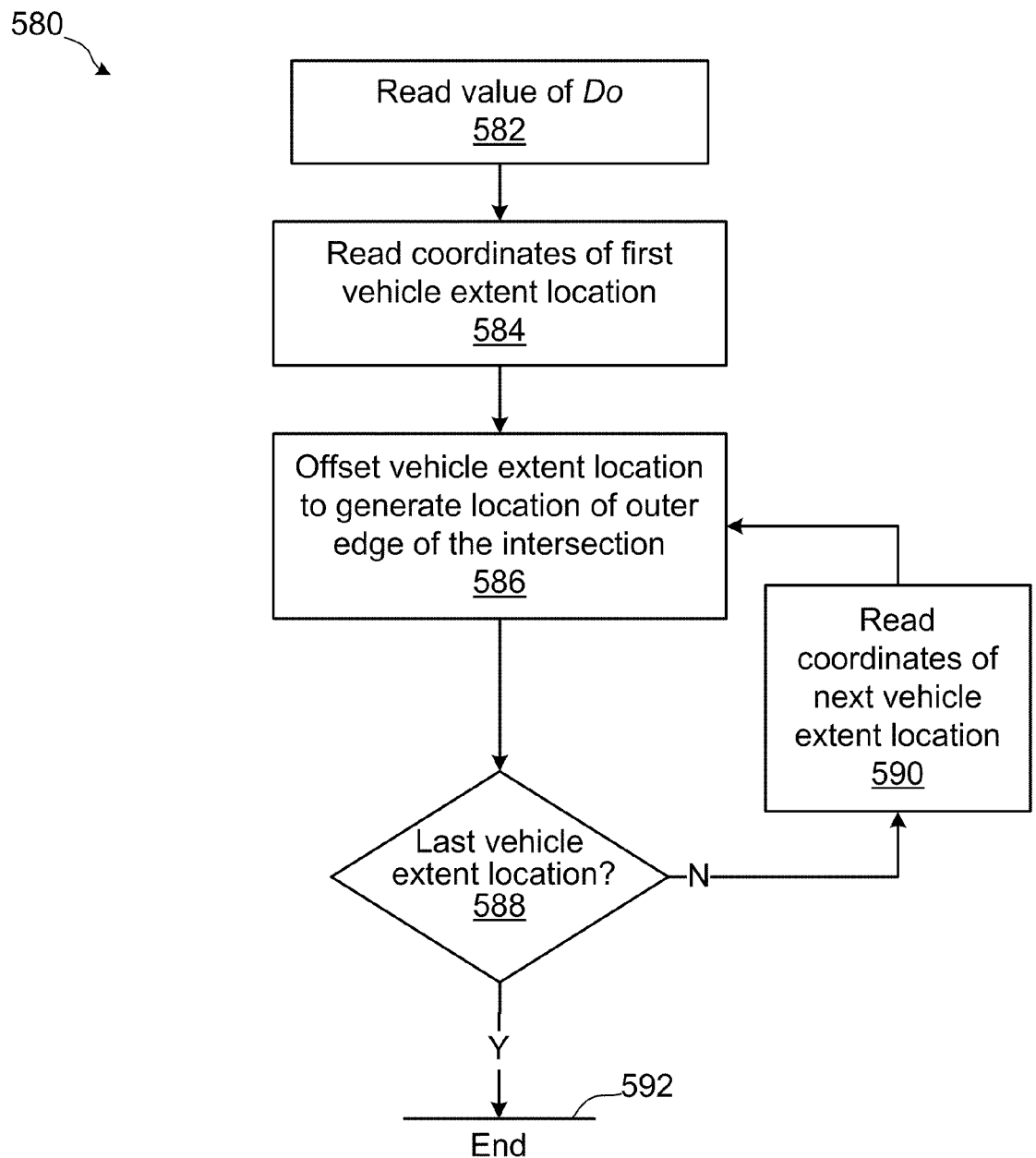
FIG. 12 is a block diagram of a process executed by the processor circuit shown in FIG. 2 for generating an outer edge of the intersection shown in FIG. 10.

A flowchart depicting blocks of code for directing the processor circuit 150 to implement a process for generating the outer edge of the intersection (bock 310 of FIG. 4) is shown at 580 in FIG. 12.

The process begins at block 582, which directs the microprocessor 152 to read the value of the offset $D_o$ from the store 210 of the variable memory 156. Block 584 then directs the microprocessor 152 to read coordinates of a first vehicle extent location of the vehicle extent locations 518 from the store 216.

Block 586 then directs the microprocessor 152 to offset the vehicle extent location to generate a location on the outer edge of the intersection area 256. In one embodiment, offsetting the vehicle extent locations involves constructing a line joining locations of a previous vehicle extent location and a next vehicle extent location to define a tangent line to the current vehicle extent location. The offset $D_0$ is then applied to the current vehicle extent location in a direction perpendicular to the tangent line.

Block 588 then directs the microprocessor 152 to determine whether the current vehicle extent location is the last vehicle extent location, in which case the process ends at 592. If at block 588 the current vehicle extent location is not the last vehicle extent location, then the process continues at block 590, which directs the microprocessor 152 to read coordinates of the next vehicle extent location from the store 216.

In an alternative embodiment, the offset $D_0$ may not be a fixed offset distance but may vary along the vehicle extent locations such that some vehicle extent locations are offset by a greater distance than other vehicle extent locations to generate the outer edges of the intersection.

In another embodiment, generating outer edges of the intersection may involve generating geometric elements as described later in connection with FIG. 28 and FIG. 29.

In another alternative embodiment of the process 580, the CAD system 102 (shown in FIG. 2) may provide an offset function for offsetting a curve by a fixed distance, and such a function may be invoked to offset the vehicle extent locations to generate the outer edges of the intersection.

Displaying the Intersection

Referring back to FIG. 4, block 312 directs the microprocessor 152 to generate display signals for causing the display 108 to display an image (such as the image of the traffic intersection 250 shown in FIG. 3). Referring again to FIG. 10, in one embodiment the reference line 280 includes first and second movable endpoints 524 and 526 which allow the operator to use the pointing device 191 to select and drag one of endpoints to a new location, thereby changing the relative orientation between the first and second reference lines. Similarly, the reference line 278 may also include moveable endpoints (not shown) allowing changes in orientation of the second roadway and/or a change in a location of the intersection area 256 between the first roadway and the second roadway.

When one of the endpoints 524 or 526 is moved to another location, the process 300 of FIG. 4 is repeated, thereby generating display signals for causing the computer display 108 to update the image representing the traffic intersection in response to the change. Other changes, such as changes to the operator input parameters stored in the store 210 of the variable memory 156, or a change in selection of the design vehicle, will generally also require that the process 300 be repeated. Accordingly, at each change, the microprocessor 152 is directed to regenerate the turning path of the design vehicle, regenerate the vehicle extent locations, and regenerate the outer edges of the intersection area as described above with reference to FIG. 9A and FIG. 9B.

Advantageously, using the bicycle model to simplify computation facilitates rapid repetition of the process 300 to facilitate updating of the displayed image in real time as the operator moves the endpoints 524 or 526 or changes any other design parameter.

Traffic Roundabout

Figure 13:
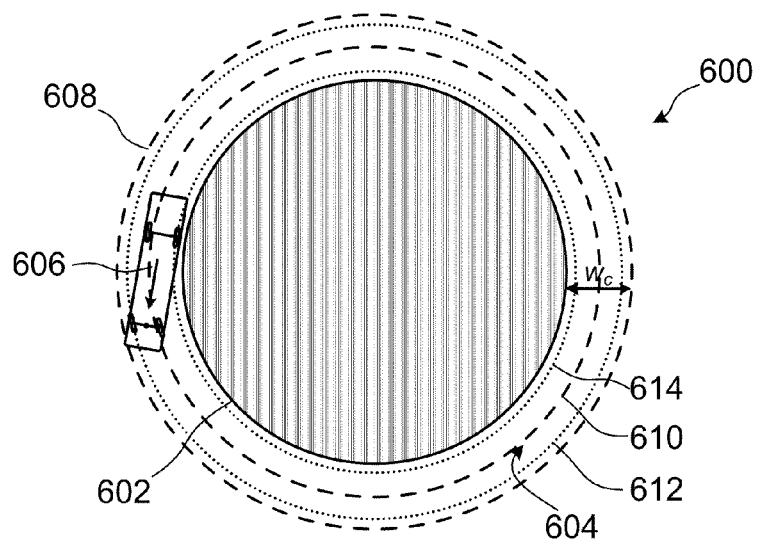
FIG. 13 is a plan view of a circulatory lane of a traffic roundabout.

In one embodiment the first roadway 252 shown in FIG. 3 may comprise a circulatory lane of a traffic roundabout, in which case the second roadway 254 acts as an approach to the traffic roundabout. Referring to FIG. 13, an exemplary traffic roundabout is shown generally at 600. The roundabout 600 includes a central island 602 surrounded by a circulatory lane 604 having an outer perimeter 608. The circulatory lane extends between the central island 602 and the outer perimeter 608.

In general, a process for displaying a representation of a circulatory lane of a roundabout involves receiving an operator selection of a design vehicle 606 for designing the intersection roundabout 600. The process also involves receiving operator input of a design element dimension for the roundabout. The operator may select the design element as the central island 608 and will then pre-define the diameter of the central island. The diameter of the outer perimeter 608 of the circulatory lane 604 is then be computed by the processor circuit 150. Alternatively, the operator may select the design element as the outer perimeter 608 of the circulatory lane 604 and will then pre-define the diameter of the outer perimeter. The diameter of the central island 602 is then computed by the processor circuit 150.

The process further involves generating a circulatory path 610 of the design vehicle traveling within the design dimension along the circulatory lane 604, and generating vehicle extent locations 612 and 614 associated with passage of the design vehicle 606 along the circulatory path 610. In the embodiment shown the circulatory path 610 is a circulatory path centerline along which the design vehicle travels (i.e. the center of the front axle) through the roundabout 600.

The vehicle extent locations are then used to compute a circulatory lane width $W_C$. For example, if the operator inputs the central island diameter as the design dimension, then the vehicle extent locations 612 is used to define a diameter of the outer perimeter 608 of the roundabout 600. Alternatively, if the operator inputs the outer perimeter diameters as the design dimension, then the vehicle extent 614 is used to define a diameter of the central island 602. The process also involves generating display signals for causing the display 108 of the computer to display an image (such as the image 600) representing the roundabout.

In one embodiment, input of the design dimension for the roundabout 600 may involve receiving CAD data representing an initial layout of the roundabout including the central island 602 and an outer perimeter 608. The CAD data may be input by the using CAD functions provided by the CAD system 102 (shown in FIG. 1). The process outlined above may then be executed to cause a selected one of the central island 602 or the outer perimeter 609 to be modified to accommodate the selected design vehicle extents 612 and 614.

In the embodiment shown in FIG. 13 the roundabout 600 has a circular shape and the central island 602 and the outer perimeter 608 is defined by a diameter of the central island or the outer perimeter. In other embodiments the roundabout 600 may be non-circular and the design dimension may include a plurality of dimensions defining the shape of the non-circular roundabout.

Figure 14:
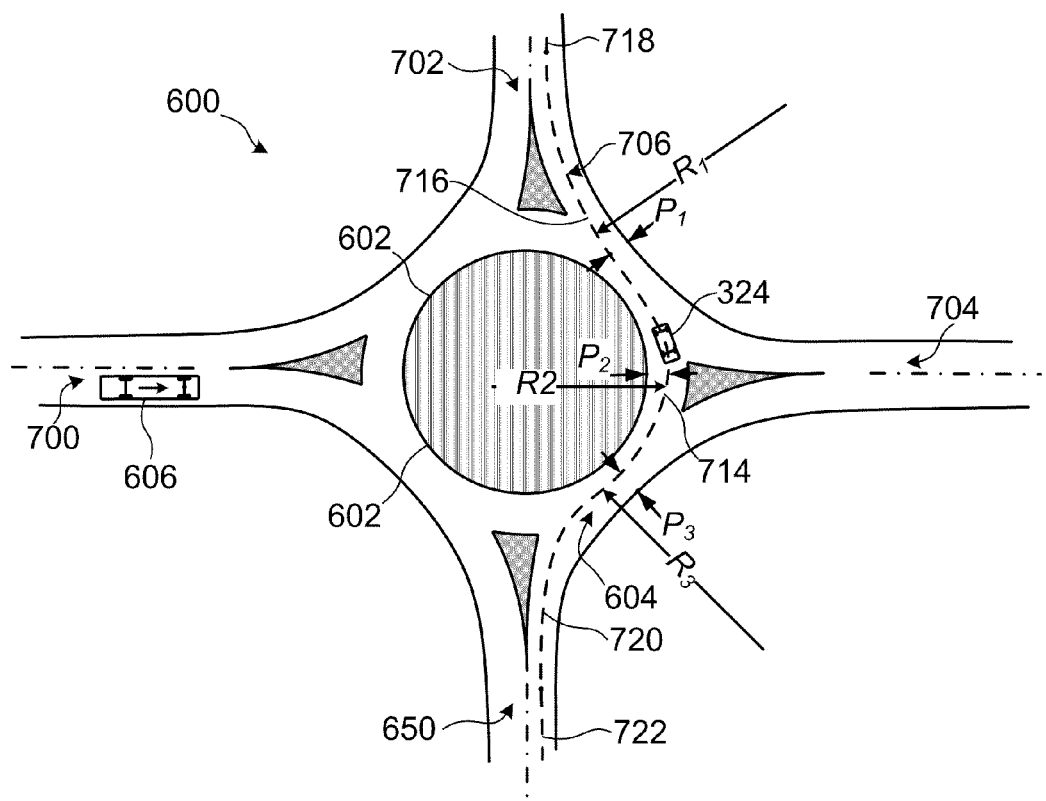
FIG. 14 is a plan view of an exemplary traffic roundabout.

Referring to FIG. 14, the roundabout 600 will generally include one or more approach lanes, such as the approach lanes 650, 700, 702, and 704 shown. In general a roundabout will include at least one approach lane and usually two or more approach lanes. A process for adding approach lanes 650, and 700-704 to the roundabout 600 is described later herein. While the approach lanes 650 and 700-704 shown in FIG. 14 are generally orthogonally located with respect to each other, in general approaches to a roundabout may be disposed at angles other than right angles. The approach lanes 650 and 700-704 of the roundabout 600 each include an entry lane and an exit lane, but in other embodiments an approach lanes may be an entry only lane or exit only lane, depending on the desired traffic flow through the roundabout.

Traffic Roundabout Operator Interface

Figure 15:
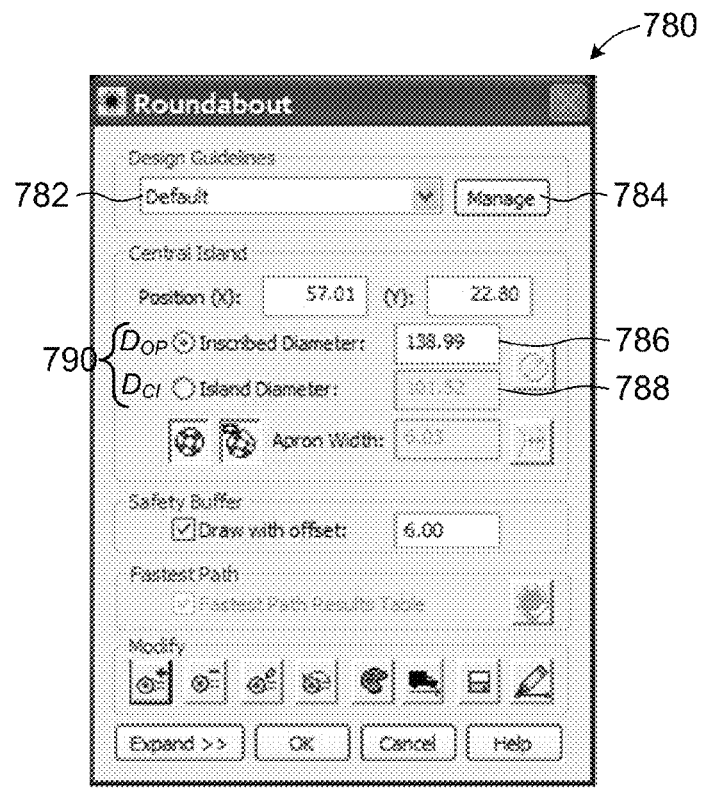
FIG. 15 is a is a screenshot of an operator interface displayed by the processor circuit shown in FIG. 2 for entering or editing roundabout design parameters.

In general, when designing a new traffic roundabout, the operator first invokes the CAD system program codes 166 in FIG. 2, which causes the CAD system application to be launched. Once launched, the CAD system facilitates launching of the program codes 168 that configure the CAD system to perform traffic intersection representation functions. In particular, when designing a roundabout, a roundabout operator interface is displayed on the display 108. Referring to FIG. 15, a screenshot of the operator interface for receiving operator input of traffic roundabout design parameters is shown generally at 780.

Figure 16:
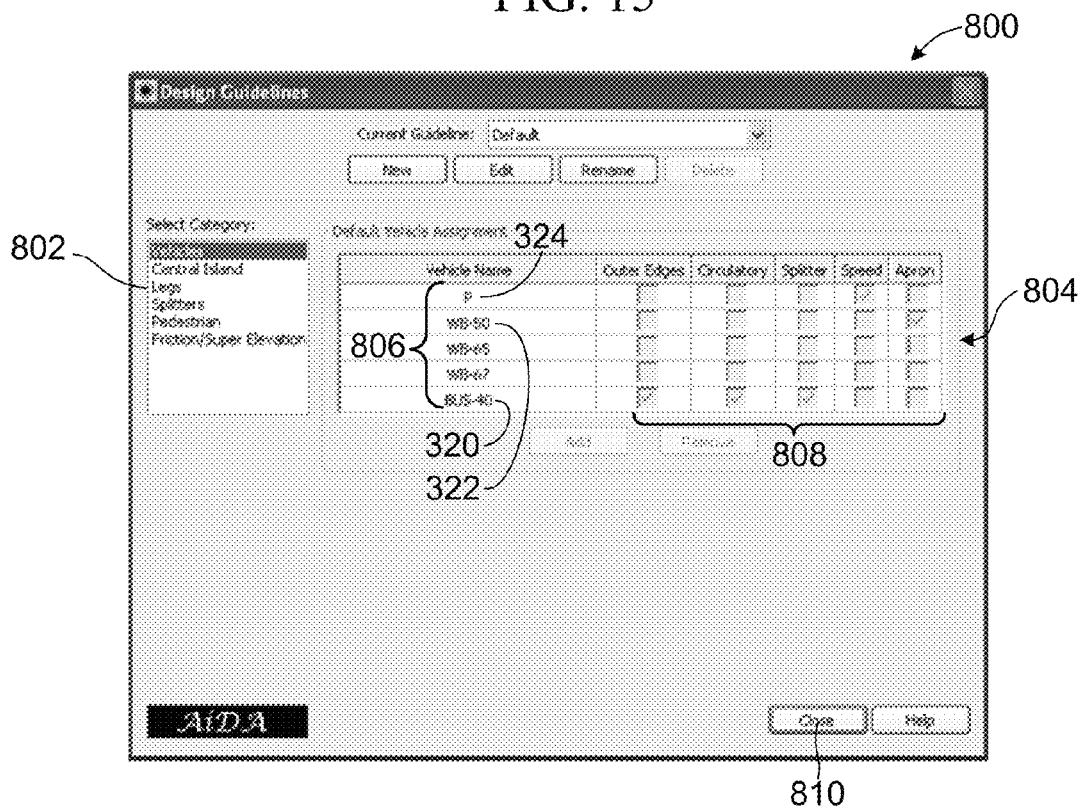
FIG. 16 is a is a screenshot of an operator interface displayed by the processor circuit shown in FIG. 2 for selecting a design vehicle.

The operator interface 780 includes a field 782 for receiving selection of a set of design guidelines for the roundabout and an actuator button 784 for launching an operator interface for managing the design guidelines. A screenshot of a design guideline operator interface displayed in response to actuation of the button 784 is shown generally at 800. Referring to FIG. 16 the design guideline interface 800 includes a plurality of design categories 802, as described in greater detail below.

Design Vehicle Selection

When the operator selects the "Vehicles" category from the design categories 802, a design vehicle assignment listing 804 is displayed in the design guideline interface 800. The vehicle assignment listing 804 permits selection of one of a plurality of different design vehicles 806 for generating various features of the intersection by selecting one of a plurality of checkboxes 808. In this embodiment, a design vehicle 320 (Bus 40) is selected as the design vehicle for outer edges, the circulatory island, and the splitter island. A design vehicle 322 (WB-50) is selected for generating the truck apron feature, and a vehicle 324 (P) is selected for calculating the fastest speed through the roundabout, as will be described later herein. The design vehicle selections made by the operator are stored in the store 218 of the variable memory 156 shown in FIG. 2.

The design vehicles 320, 322, and 324 and the design vehicle parameters 340 have been described above in connection with FIG. 5 and FIG. 6 respectively.

Offsets

Figure 17:
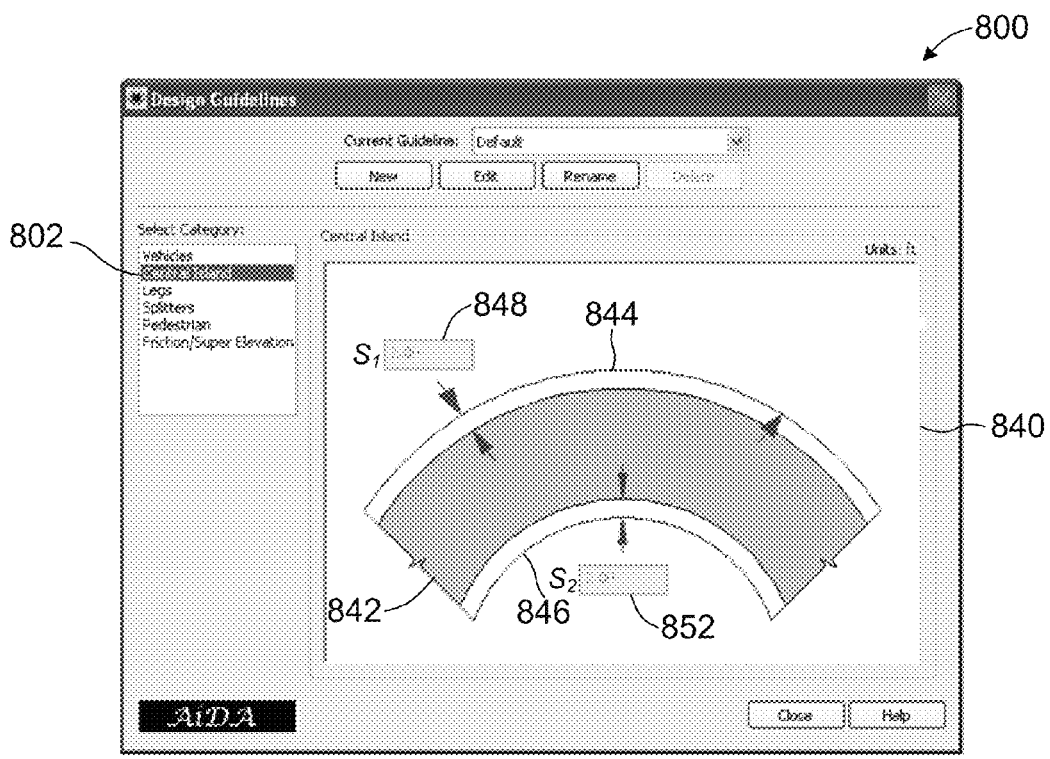
FIG. 17 is a is a screenshot of an operator interface displayed by the processor circuit shown in FIG. 2 for entering offsets for a circulatory lane.

Referring now to FIG. 17, the design guideline interface 800 is shown with the "Central Island" design category 802 selected, which causes display of a representation 840 of a portion of a circulatory lane 842 for defining default offset distances. In general the offset distances provide a clearance allowance for the selected design vehicle travelling along the circulatory lane 842. The circulatory lane 842 is bounded by the outer perimeter 844 and central island 846 (or a truck apron, if present). The representation 840 includes a field 848 for inputting a value for an offset $S_1$ from the outer perimeter 844, and a field 852 for inputting a value of an offset $S_2$ from the central island 846. The offset values in the fields 848 and 852 are stored in the store 220 of the variable memory 156.

Figure 18:
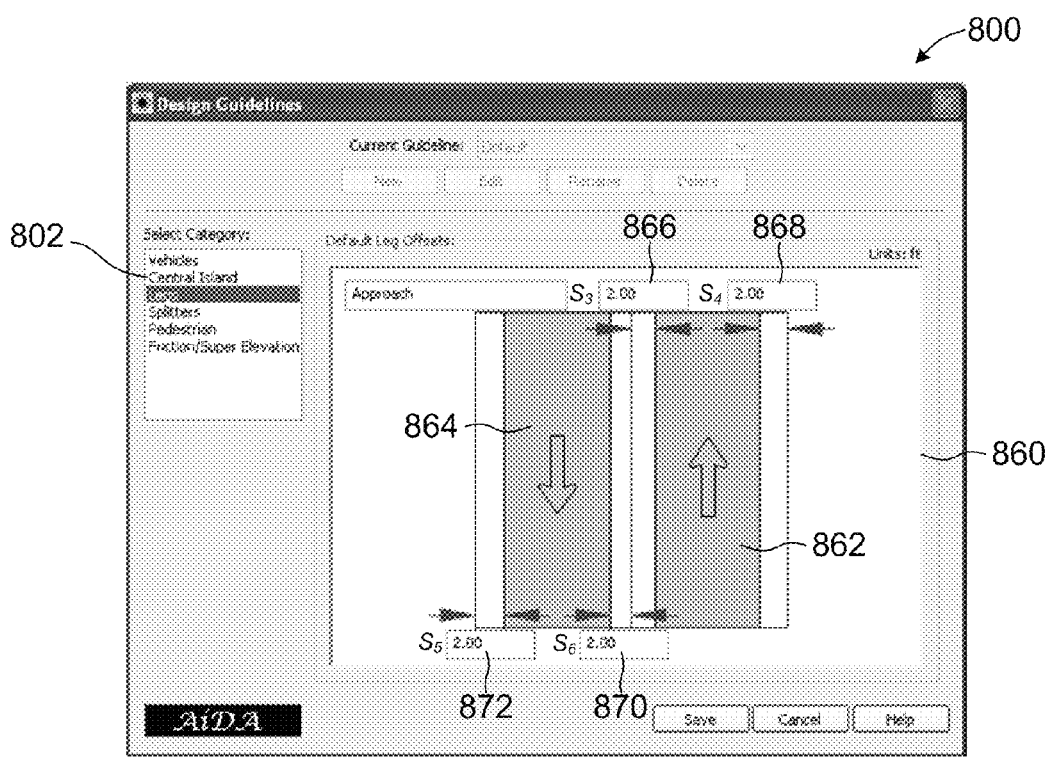
FIG. 18 is a is a screenshot of an operator interface displayed by the processor circuit shown in FIG. 2 for entering offsets for an approach lane.

Referring to FIG. 18, the design guideline interface 800 is shown with the "Legs" design category 802 selected, which causes display of a representation 860 of a portion of approach lanes 862 and 864 for defining default offset distances. The representation 860 includes fields 866 and 868 for inputting offset values $S_3$ and $S_4$ for the entry lane 862, and fields 872 and 874 for inputting offset values $S_5$ and $S_5$ for the exit lane 864. The offset values in the $S_3$-$S_5$ are stored in the store 220 of the variable memory 156.

Figure 19:
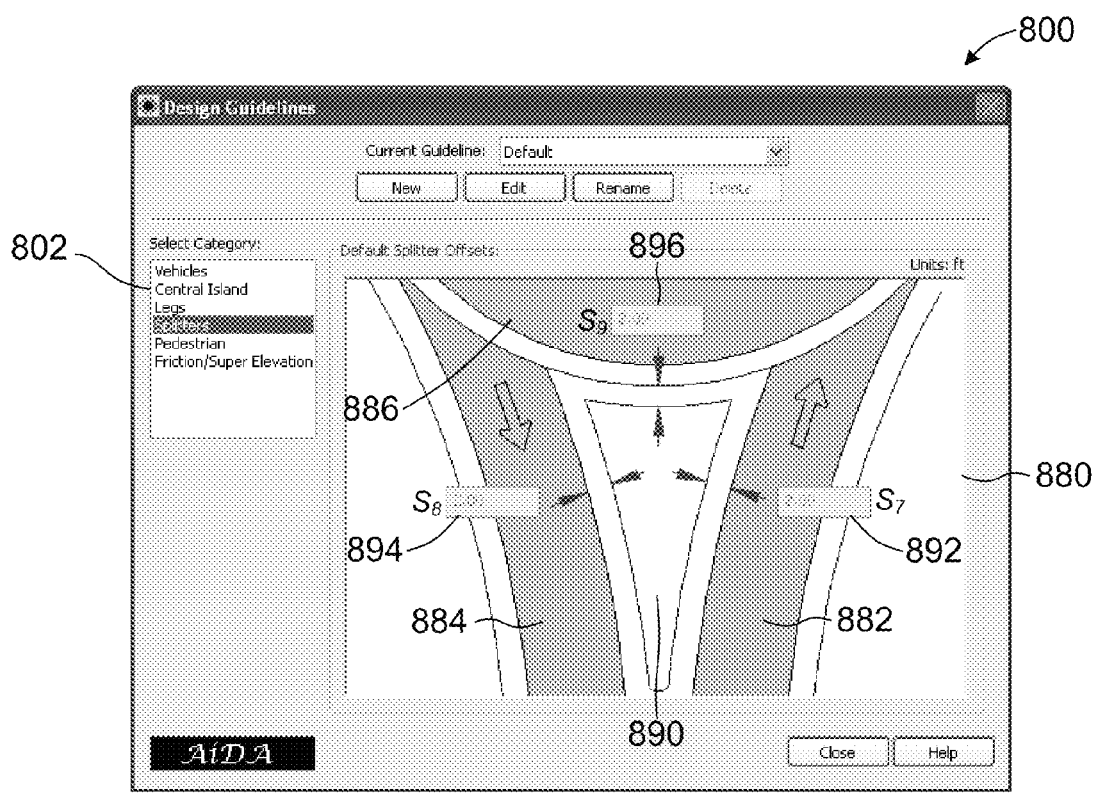
FIG. 19 is a is a screenshot of an operator interface displayed by the processor circuit shown in FIG. 2 for entering offsets for a splitter island.

Referring to FIG. 19, the design guideline interface 800 is shown with the "Splitters" design category 802 selected, which causes display of a representation 880 of a portion of the approach lanes 882 and 884 and a portion of the circulatory lane 886 for defining default offset distances from a splitter island 890. The representation 880 includes a field 892 for inputting an offset value $S_7$ between the splitter island 890 and the entry lane 882, and a field 894 for inputting an offset value $S_8$ between the splitter island and the exit lane 884. The representation 880 also displays a field 896 for inputting an offset value $S_5$ between the splitter island 890 and the circulatory lane 886. The offset values in the fields 892-896 are stored in the store 220 of the variable memory 156.

Design Dimension

Referring back to FIG. 15, the roundabout operator interface 780 also includes an inscribed diameter field 786 for receiving operator input of a diameter of the outer perimeter $D_{OP}$ and a central island diameter field 788 for receiving operator input of a central island diameter $D_{CI}$. The operator interface 780 also includes a pair of radio-button fields 790 for selecting which of the values $D_{OP}$ and $D_{CI}$ in the fields 786 and 788 to use as the design element dimension for the traffic roundabout at block 620. When the operator selects one of the radio-buttons 790 and enters a value in the associated field, the value is stored in the design diameter store 222 of the variable memory 156.

In one embodiment, the design dimension value entered by the operator may be compared with the steering lock angle (shown at 342 in FIG. 6) of the selected design vehicle to determine whether the entered design dimension is meets a turning circle criterion of the design vehicle. The processor circuit 150 may be configured to cause a warning signal to warn the operator that the design dimension does not meet the turning circle criterion. The warning signal may cause an audible alert and/or an operator interface to be displayed for warning the operator. The turning circle criterion may be a radius computed using Eqn 4, where the nΔϕ term is replaced with the steering lock angle 342.

Circulatory Path Generation

Figure 20:
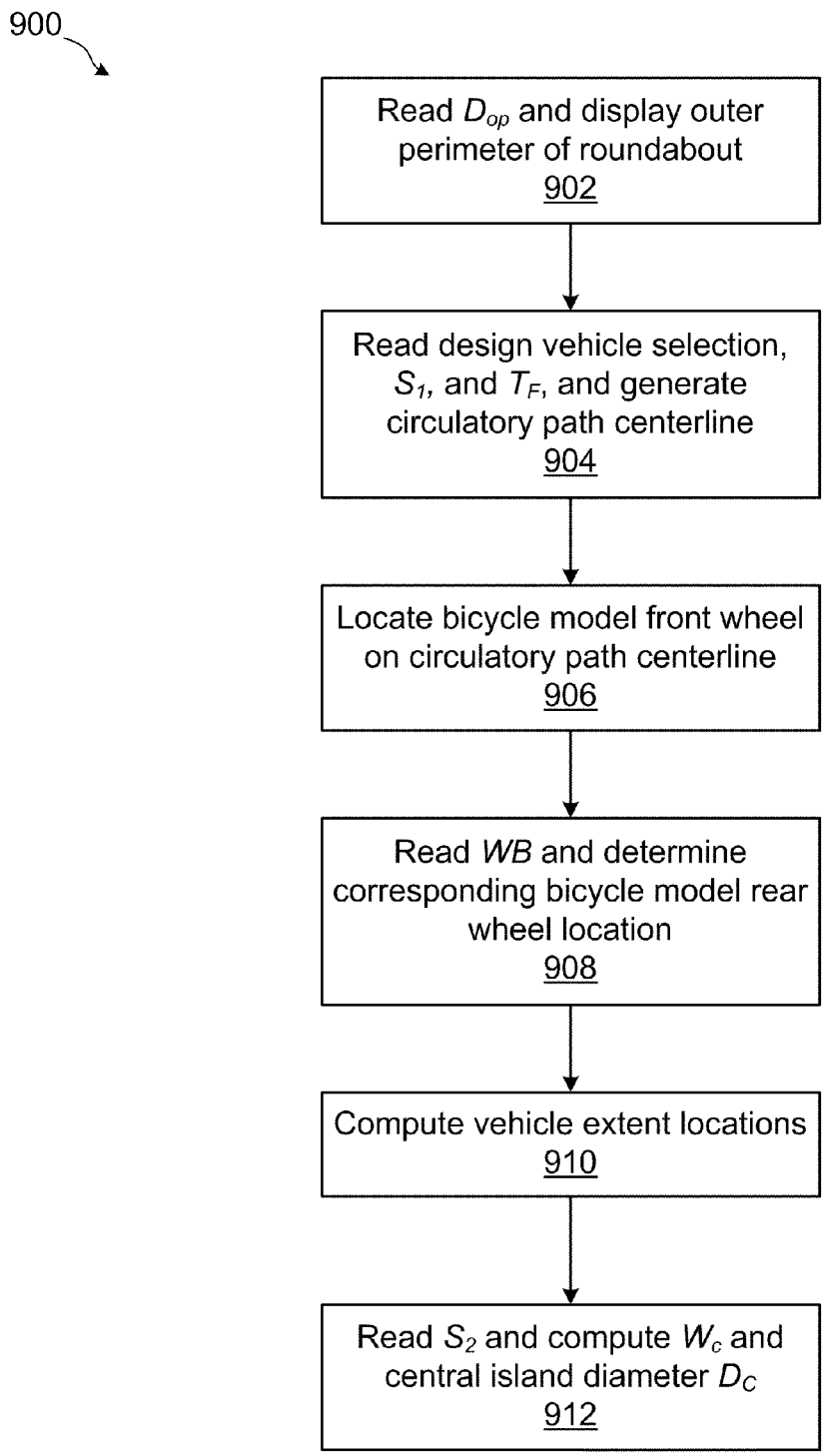
FIG. 20 is a block diagram of a process executed by the processor circuit shown in FIG. 2 for displaying a representation of a roundabout.

Referring to FIG. 20, a flowchart depicting blocks of code for directing the processor circuit display a representation of the roundabout 600 shown in FIG. 13 in accordance with a first operational embodiment of the invention is shown generally at 900. In this first process embodiment the representation of the traffic roundabout is generated in response to receiving operator input of a design diameter of the outer perimeter of the roundabout when the operator selects the radio button 790 corresponding to $D_{OP}$ as described above.

Figure 21:
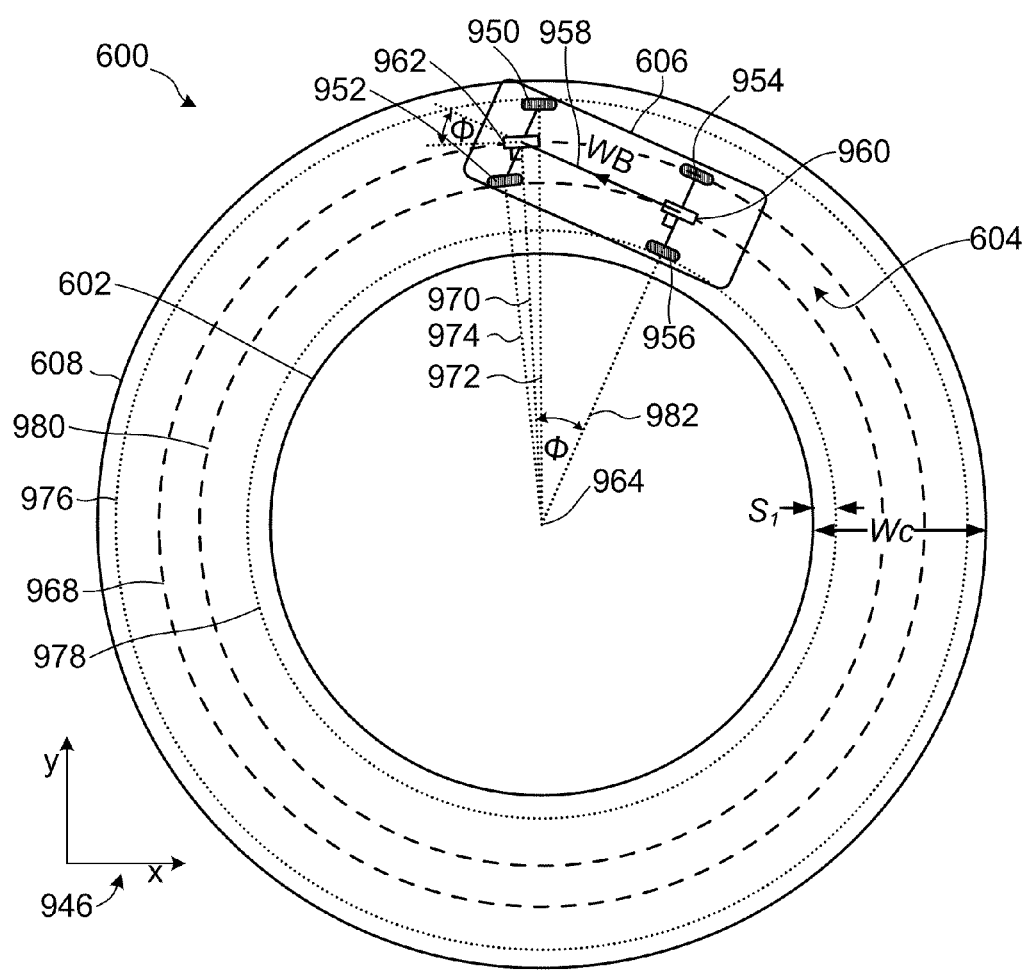
FIG. 21 is a plan view of a circulatory lane of a traffic roundabout displayed in accordance with the process of FIG. 20.

The process 900 begins at block 902, which directs the microprocessor 152 to read the design diameter $D_{OP}$ from the store 222 and to invoke a CAD function for displaying the outer perimeter of the roundabout. Referring to FIG. 21 the traffic roundabout 600 (shown in FIG. 13) is shown in greater detail. The outer perimeter is shown at 608. In general the elements making up the roundabout 600 are defined by coordinates in an x-y Cartesian coordinate system 946.

Block 904 then directs the microprocessor 152 to read the design vehicle selection from the store 218 of the variable memory 156, to read the offset distance value $S_1$ from the store 220, and to read the track width $T_F$ of the front wheels of the design vehicle from the design vehicle database 200.

Block 904 also directs the microprocessor 152 to generate a circulatory path centerline. The circulatory path centerline is shown at 968 and is spaced inwardly from the outer perimeter 608. The circulatory path centerline diameter is computed in accordance with the formula:

$$D_C = D_{op} - 2S_1 - T_F \quad \text{Eqn 5}$$

where:
$D_C$ is the diameter of the circular path centerline 948;
$D_{op}$ is the design diameter (i.e. the diameter of the outer perimeter);
$S_1$ is the first offset distance; and
$T_F$ is the track width of a front axle group of the design vehicle 606.

Block 906 then directs the microprocessor 152 to locate a steerable front wheel 962 of a bicycle model 958 of the selected design vehicle on the circulatory path centerline 968.

In this embodiment, it is assumed that the bicycle model 958 (and the design vehicle 606), obey Ackerman's steering principle, in which case the wheels are always oriented perpendicular to a radial line drawn from a turning circle center 964. While the Ackerman steering principle ignores some dynamic and compliant effects, using this principle and the bicycle model provide for computational efficiency thus facilitating real time recalculation of the intersection geometry in response to operator input. Accordingly, the front wheel 962 is located perpendicular to a radial line 970 (which has a diameter of ½$D_c$), and the steering angle of the bicycle model front wheel 962 is given by the formula:

$$\phi = \cos^{-1}\left[\frac{WB}{\frac{1}{2}D_C}\right] \quad \text{Eqn 6}$$

where:
ϕ is the steering angle of the wheel 962;
WB is the bicycle model wheelbase (i.e. the design vehicle wheelbase);
$D_c$ is the circulatory path centerline diameter.

Block 908 then directs the microprocessor 152 to read a wheelbase value WB from the design vehicle database 200 and to determine a rear wheel location for the bicycle model 958. The location of the rear wheel 960 is determined by generating a line of length WB extending outwardly from a center location of the front wheel 962 in a direction defined by the steering angle ϕ. The rear wheel 960 is oriented at an angle corresponding to the angle ϕ, and is thus aligned with the WB line.

The process then continues at block 910, which directs the microprocessor 152 to use the locations of the front and rear wheels 962 and 964 to generate vehicle extent locations for the design vehicle, as described earlier in reference to FIG. 8. The selected design vehicle (i.e. the design vehicle shown at 606) includes a front right hand side wheel 952, a front left hand side wheel 952, and right and left hand side rear wheels 954 and 956 respectively. Each of the wheels of the design vehicle 606 is perpendicular to a respective radial line extending outwardly from the turning circle center 964. For example, the front wheel 950 is perpendicular to the radial line 972 and the front left wheel 952 is perpendicular to the radial line 974.

An outer edge of the rear left wheel 956 defines an inner vehicle extent 978, which lies on a circle having a diameter $D_I$. In this embodiment other design vehicle features, such as fenders and bumpers for example, are assumed to clear a curb of the central island, and thus the rear left wheel 956 defines the vehicle extents 978. In other embodiments, the design vehicle 606 may have other features that define the vehicle extents, such as a particularly wide load or a portion of the vehicle body that protrudes beyond the wheels at a height that would engage the curb of the central island. Similarly, should the central island 602 have a curb height that exceeds a standard curb height, other vehicle extents may need to be taken into account when determining the vehicle extents.

The process then continues at block 912, which directs the microprocessor 152 to read the value of $S_2$ from the store 220 and to compute the diameter $D_{CI}$ of the central island 602 and the circulatory lane width $W_C$:

$$D_{CI} = D_I - 2S_2 \qquad \text{Eqn 7}$$

$$W_C = D_{CI} - D_{OP} \qquad \text{Eqn 8}$$

The process 900 has been described for a case where the operator has selected the outer perimeter 608 as defining the design diameter.

Figure 22:
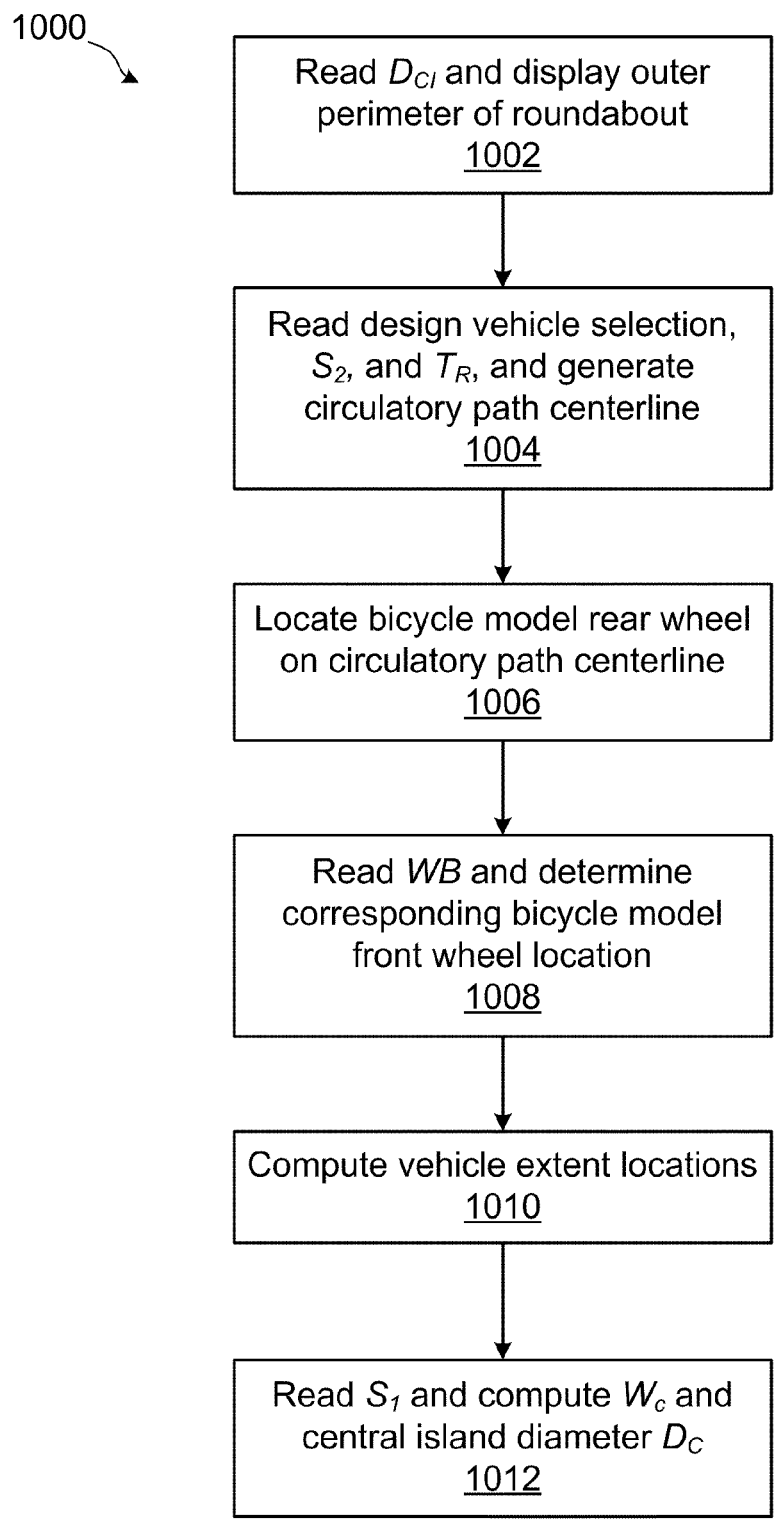
FIG. 22 is a block diagram of a process executed by the processor circuit shown in FIG. 2 for displaying a representation of a roundabout in accordance with an alternative embodiment of the invention.
Figure 23:
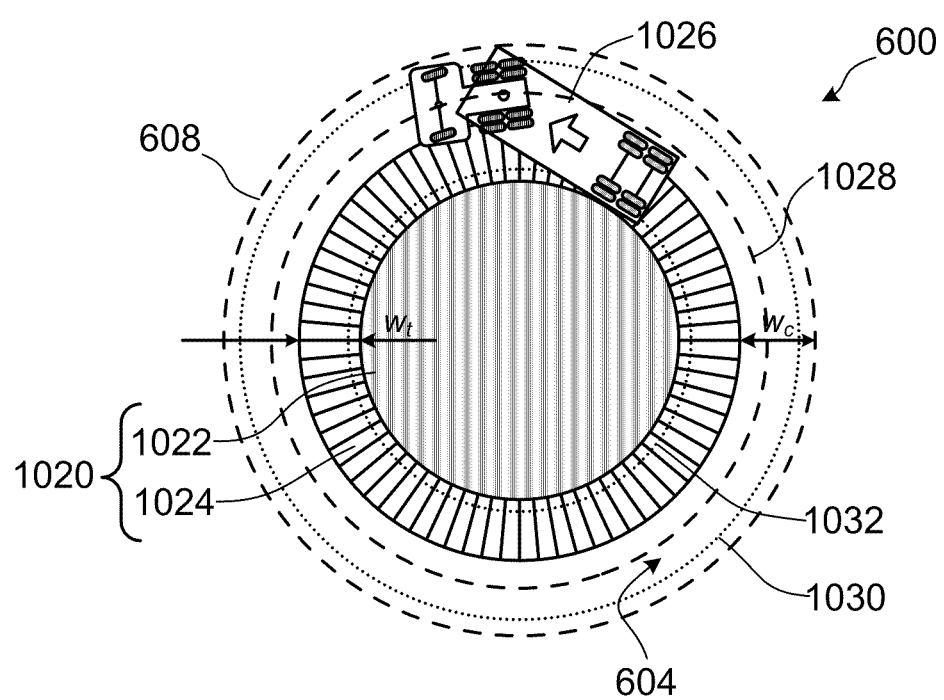
FIG. 23 is a plan view of a roundabout having a truck apron in accordance with another embodiment of the invention.

Referring to FIG. 22, a flowchart depicting blocks of code for directing the processor circuit display a representation of the roundabout 600 in accordance with a second operational embodiment of the invention is shown generally at 1000. In this second process embodiment the representation of the traffic roundabout is generated in response to receiving operator input of a design diameter of the central island of the roundabout when the operator selects the radio button 790 corresponding to $D_{CI}$ as described above.

The process 1000 begins at block 1002, which directs the microprocessor 152 to read the design diameter $D_{CI}$ from the store 222 and to invoke a CAD function for displaying the central island 902 of the roundabout 600.

Block 1004 then directs the microprocessor 152 to read the design vehicle selection from the store 218 of the variable memory 156, to read the offset distance value $S_2$ from the store 220, and to read the track width $T_R$ of the rear wheels of the design vehicle from the design vehicle database 200. Block 1004 also directs the microprocessor 152 to generate a circulatory path centerline. The circulatory path centerline is shown at 980 and is spaced outwardly from the central island 602. The circulatory path centerline diameter is computed in accordance with the formula:

$$D_C = D_{CI} + 2S_2 + T_R \qquad \text{Eqn 9}$$

where:
$D_C$ is the diameter of the circular path centerline 980;
$D_{CI}$ is the design diameter (i.e. the diameter of the central island);
$S_2$ is the second offset distance; and $T_R$ is the track width of a rear axle group of the design vehicle 606.

Block 1006 then directs the microprocessor 152 to locate the rear wheel 962 of the bicycle model 958 on the circulatory path centerline 980. The rear wheel 960 is located perpendicular to a radial line 982 (which has a diameter of $\frac{1}{2}D_c$).

Block 1008 then directs the microprocessor 152 to read a wheelbase value WB from the design vehicle database 200 and to determine a front wheel location for the bicycle model 958. The location of the front wheel 960 is determined by generating a line of length WB extending outwardly from a center location of the rear wheel 962 in a direction aligned with the rear wheel. The front wheel angle is defined by the steering angle $\phi$ given by the formula:

$$\phi = \cot^{-1}\left[\frac{\frac{1}{2}D_C}{WB}\right] \qquad \text{Eqn 6}$$

where:
$\phi$ is the steering angle of the wheel 962;
WB is the bicycle model wheelbase (i.e. the design vehicle wheelbase);
$D_c$ is the circulatory path centerline diameter.

The process then continues at block 1010, which directs the microprocessor 152 to use the locations of the front and rear wheels 962 and 964 to generate vehicle extent locations 978 and for the design vehicle. An outer edge of the front right wheel 950 defines an outer vehicle extent 976, which lies on a circle having a diameter $D_O$ The process then continues at block 1012, which directs the microprocessor 152 to read the value of $S_1$ from the store 220 and to compute the diameter $D_{OP}$ of the central island 602:

$$D_{OP} = D_O - 2S_1 \qquad \text{Eqn 9}$$

The circulatory lane width $W_C$ is then computed from Eqn 8 above.

Truck Apron

In some embodiments the traffic roundabout 600 may further include a truck apron. Referring to FIG. 18, the roundabout 600 is shown having a central island 1020 having a raised central portion 1022 surrounded by a truck apron 1024. The truck apron 1024 is a mountable portion of the central island 1020 that facilitates use of the roundabout 600 by large vehicles, such as the articulated vehicle 1026. The truck apron 1024 is generally delineated from the circulatory lane 604 by different paving material (e.g. paving bricks) and/or by a height differential that is less than a curb height of the raised portion 1022 of the central island 1020. For example, the truck apron 1024 may be raised by about 50 mm with respect to the circulatory lane 604, while the central island may have a curb height of 150 mm. Smaller vehicles, such as the vehicle 606 shown in FIG. 13, are able to use the circulatory lane 604 without mounting the truck apron 682.

In one embodiment the width $W_t$ of the truck apron 1024 may be input by the operator, in which case the width $W_c$ of the circulatory lane and the diameter of the central island 1020 is computed in accordance with the process 630 shown in FIG. 14. The truck apron 1024 width $W_t$ is then used to determine a location of the raised central portion 1022. In such an embodiment, the operator decides on the width $W_t$ of the traffic apron, and the design vehicle 1026 will have to be manually verified to pass through the roundabout 600 by the operator.

In other embodiments the width $W_t$ of the truck apron may be determined using the design vehicle 1026 to compute a modified circulatory path generally in accordance with the process 900 shown in FIG. 20. At block 904, the microprocessor 152 is directed to read the operator selection of the design vehicle for the truck apron as described above in connection with FIG. 18. In this case the selected design vehicle for the truck apron is the articulated vehicle 1026. The process continues generally as shown in FIG. 20, using the track width and wheelbase dimensions defining the design vehicle 1026 to generate the circulatory path centerline diameter and generate a bicycle model. Block 910 then directs the microprocessor 152 to generate vehicle extent locations 1032, which are offset by the distance $S_2$ to compute the combined width of the circulatory lane $W_c$ and the truck apron $W_t$. The truck apron width $W_t$ is then computed by subtracting previously determined $W_c$ from the overall width ($W_t+W_c$).

Approach Lanes

Figure 24:
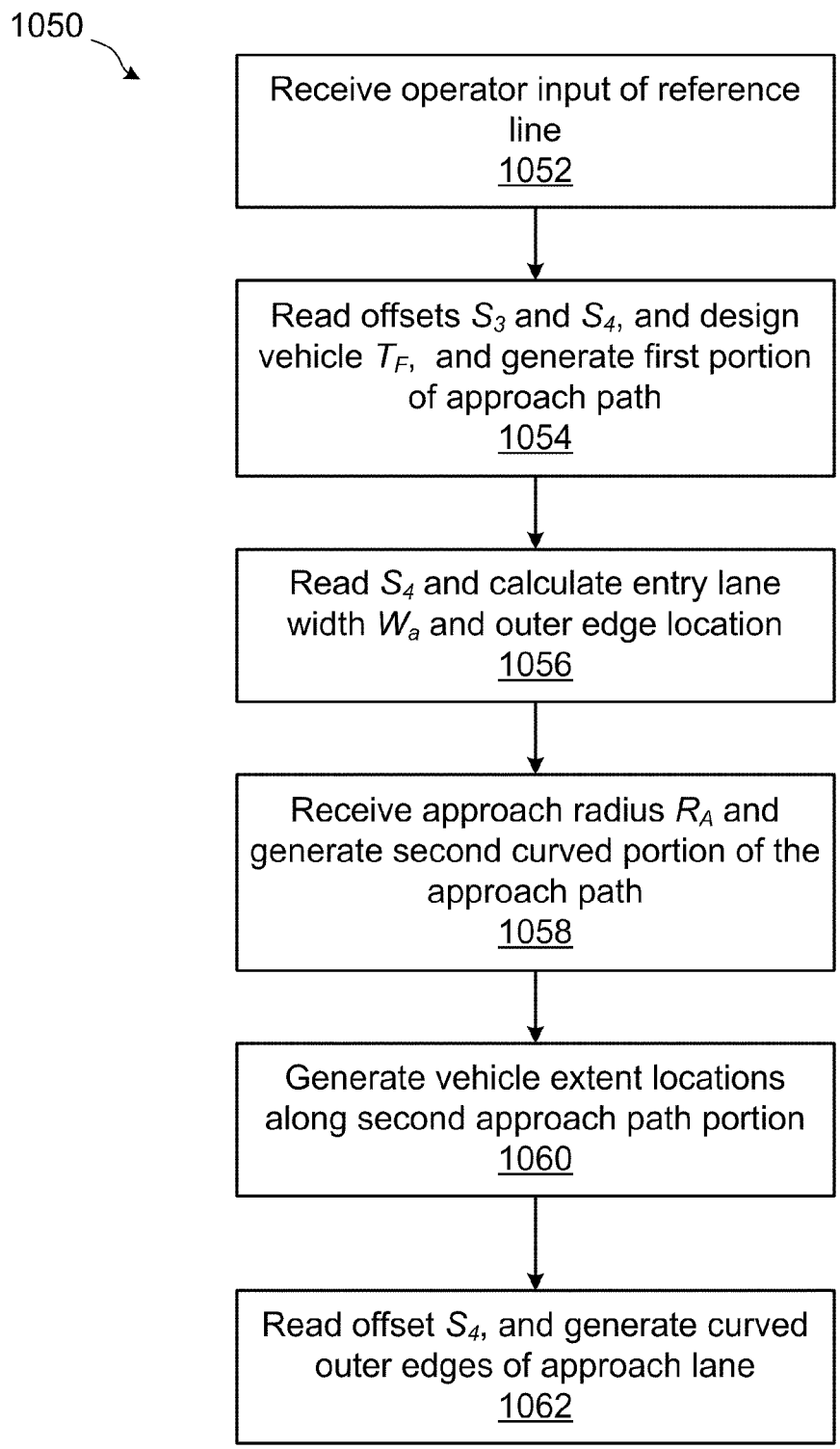
FIG. 24 is a block diagram of a process executed by the processor circuit shown in FIG. 2 for adding an approach lane to the roundabout shown in FIG. 21.
Figure 25:
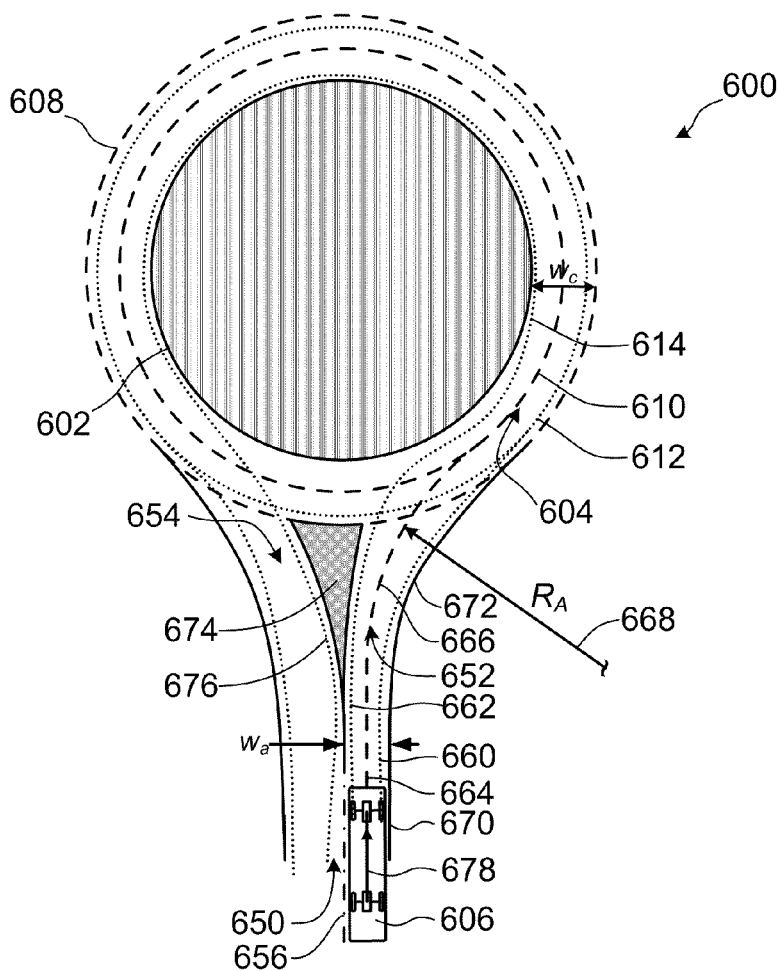
FIG. 25 is a plan view of a roundabout and approach lane displayed in accordance with the process of FIG. 24

Referring to FIG. 24, a flowchart depicting blocks of code for directing the processor circuit 150 to add an approach lane to the roundabout 600 is shown generally at 1050. The process begins at block 1052, which directs the microprocessor to receive operator input of a reference line defining an orientation of the approach to the roundabout. Referring to FIG. 25, the reference line is shown at 656 and defines a centerline for an approach lane 650. In this embodiment the reference line 656 is a straight line, but in other embodiments may be curved. In the embodiment shown in FIG. 25, the approach lane 650 includes an entry lane 652 and an exit lane 654.

Block 1054 directs the microprocessor 152 to read the offsets $S_3$ and $S_4$ from the store 220 and to read the track dimension $T_F$ of the front axle of the design vehicle 606 from the design vehicle database 200. Block 1054 also directs the microprocessor 152 to generate a first approach portion 658 for the design vehicle. The first approach portion 658 is spaced outwardly from the reference line 656 by a distance given by the formula:

$$S_A = S_3 + \tfrac{1}{2} T_F \qquad \text{Eqn 10}$$

where:
$S_A$ is the offset from the reference line to the first approach portion;
$S_3$ is the inner offset distance; and
$T_F$ is the track width of a front axle group of the design vehicle 606.

Block 1056 then directs the microprocessor 152 to read $S_4$ from the store 220 and to compute a width $W_a$ of the entry lane 652. The width $W_a$ is given by:

$$W_A = S_1 + T_F + S_3 \qquad \text{Eqn 11}$$

where $S_3$ is the outer offset distance. The width $W_a$ defines a location for an outer edge 670 of the entry lane 652.

The process then continues at block 1058, which directs the microprocessor 152 to receive operator input of an approach radius $R_A$. The approach radius $R_A$ is shown at 668 in FIG. 25 and defines the curved second portion 66 of the approach path which extends from the first portion 664 and is joins the circulatory path centerline 610 at a tangent point.

Figure 26:
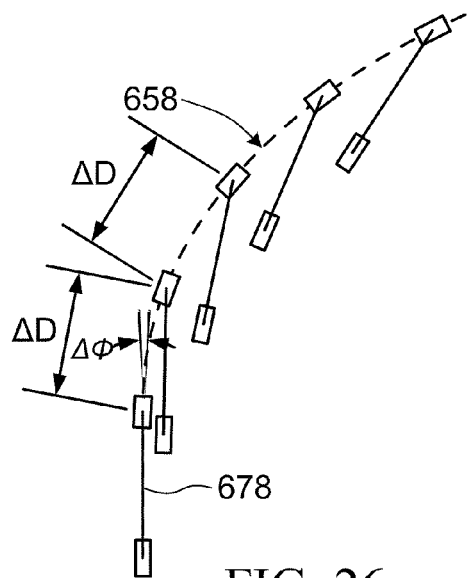
FIG. 26 is a schematic representation of a portion of an approach path generated by the process shown in FIG. 24.

Block 1060 then directs the microprocessor 152 to generate vehicle extent locations along the first and second approach path portions 664 and 666. The vehicle extents are generated by moving a bicycle model 678 of the design vehicle 606 along the approach path and generating vehicle extent locations 660 as described above in connection with FIG. 8. Referring to FIG. 26, the bicycle model 678 is moved along the approach path 658 by successive increments of $\Delta D$ (read from the store 214 of the variable memory 156). At each successive increment a steering angle $\phi$ is incremented by $\Delta \phi$, where $\Delta \phi$ is an angle between the current steering angle of the front wheel of the bicycle model 678 and a line drawn tangent to the approach path 658. The front wheel of the bicycle model 678 is then moved to the next location located the distance $\Delta D$ along the approach path. At each successive location, the vehicle extents may be generated for the front right hand side wheel of the design vehicle 606 (extents 660 in FIG. 25), and for the rear left hand side wheel of the design vehicle (extents 662 in FIG. 25).

Referring back to FIG. 24, the process then continues at block 1062, which directs the microprocessor 152 to read the offset $S_4$ and to generate the outer edge 672 of the roundabout offset from the vehicle extent locations 660 by the offset $S_4$.

The process 1050 may also be used to generate outer edges of the exit lane 654 and to generate the approach lanes 652, 654 and 656 shown in FIG. 14.

Splitter Island

The embodiment shown in FIG. 15 also includes a splitter island envelope 674, which separates the entry lane 652 and the exit lane 654 proximate the circulatory lane 604. A splitter island may be marked out within the splitter island envelope 674 using painted lane markings or may be constructed using a raised portion and surrounding curb. The splitter island envelope thus represents an enclosed area within which the splitter island may be constructed without encroaching on the path of the design vehicle.

The shape and extent of the splitter island envelope 674 is defined as an area enclosed by the vehicle extent locations 662 defined by the approach path of the design vehicle 606, the vehicle extent locations 612 defined by the circulator path of the design vehicle, and vehicle extent locations 676 defined by passage of the design vehicle along the exit lane 654. The splitter island envelope 674 may be spaced apart from the vehicle extents by offsets $S_7$, $S_8$, and $S_9$ (as shown in FIG. 19) read from the store 220 of the variable memory 156, which provide a clearance allowance for the design vehicle 606 to maneuver through the traffic roundabout 600.

Fastest Path

While the respective diameters of outer perimeter 608 and the central island 602 of the roundabout 600 are sized in accordance with the larger design vehicle 606, of concern when designing a roundabout is the speed of a smaller passenger vehicle (i.e. the passenger vehicle 324 shown in FIG. 5). Referring to FIG. 14, the passenger vehicle 324 has additional room to manoeuvre through the roundabout 600 and thus may be able to travel along a path 706 that has insufficient deviation to cause the vehicle to slow down to a safe speed for passage through the roundabout. The path 706 is commonly referred to as the fastest path.

Figure 27:
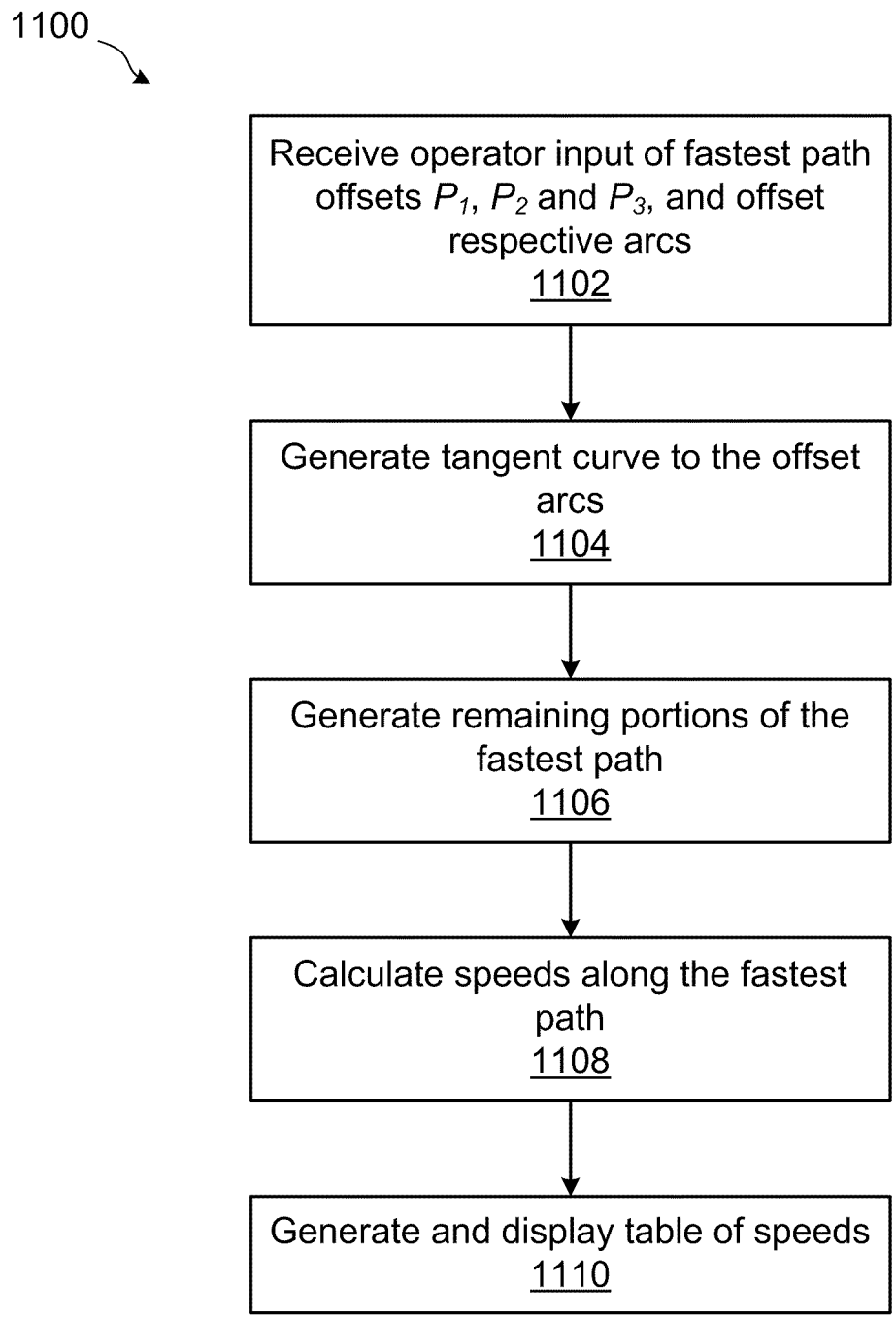
FIG. 27 is a block diagram of a process executed by the processor circuit shown in FIG. 2 for generating a fastest path of a design vehicle through the roundabout shown in FIG. 14.

Referring to FIG. 27, a flowchart depicting blocks of code for directing the processor circuit 150 to generate the fastest path 706 is shown generally at 1100. The process begins at block 1102, which directs the microprocessor 152 to receive operator input of offsets $P_1$, $P_2$, and $P_3$. The offsets $P_1$, $P_2$, and $P_3$ respectively define distances for offsetting the arcs defining the outer edge of approach 702, the central island 602, and the outer edge of the approach 650 respectively.

Block 1104 then directs the microprocessor 152 to generate an arc portion 714 that is tangent to each of the three arcs. The curve portion 714 has a radius $R_2$.

Block 1106 directs the microprocessor 152 to generate an arc portion 716 that is tangent to the arc 714 at the tangent point $P_1$ and to a generally linear portion 718 of the path 706. The arc portion 716 has a radius $R_1$. Block 1106 also directs the microprocessor 152 to generate an arc portion 720 that is tangent to the arc 714 at the tangent point $P_3$ and to a generally linear portion 722 of the path 706. The arc portion 720 has a radius $R_3$.

Block 1108 then directs the microprocessor 152 to compute speeds at points along the fastest path corresponding to the radii $R_1$, $R_2$, and $R_3$ in accordance with the formula:

$$V = \sqrt{127 R \left(\frac{e}{100} + f\right)} \qquad \text{Eqn 12}$$

where:
 V is a velocity of the fastest path design vehicle in kilometers per hour;
 R is the radius of the arc portion ($R_1$, $R_2$, or $R_3$) in meters;
 e is the superelevation of the roadway proximate the curved path portion; and
 f is the side friction factor.

Eqn 12 may be used to compute the speed V along each of the arc portions $R_1$, $R_2$, and $R_3$ by substituting the respective values for R in Eqn 12. Block 1110 then directs the microprocessor 152 to generate a table of the speeds through the roundabout and display the table on the display 108.

Alternatively, the path 706 may be generated using spline functions to represent the path. The CAD system 102 shown in FIG. 2 may provide spline functions that permit construction of a spline curve through the offset points $P_1$, $P_2$, and $P_3$.

Geometric Elements

Figure 28:
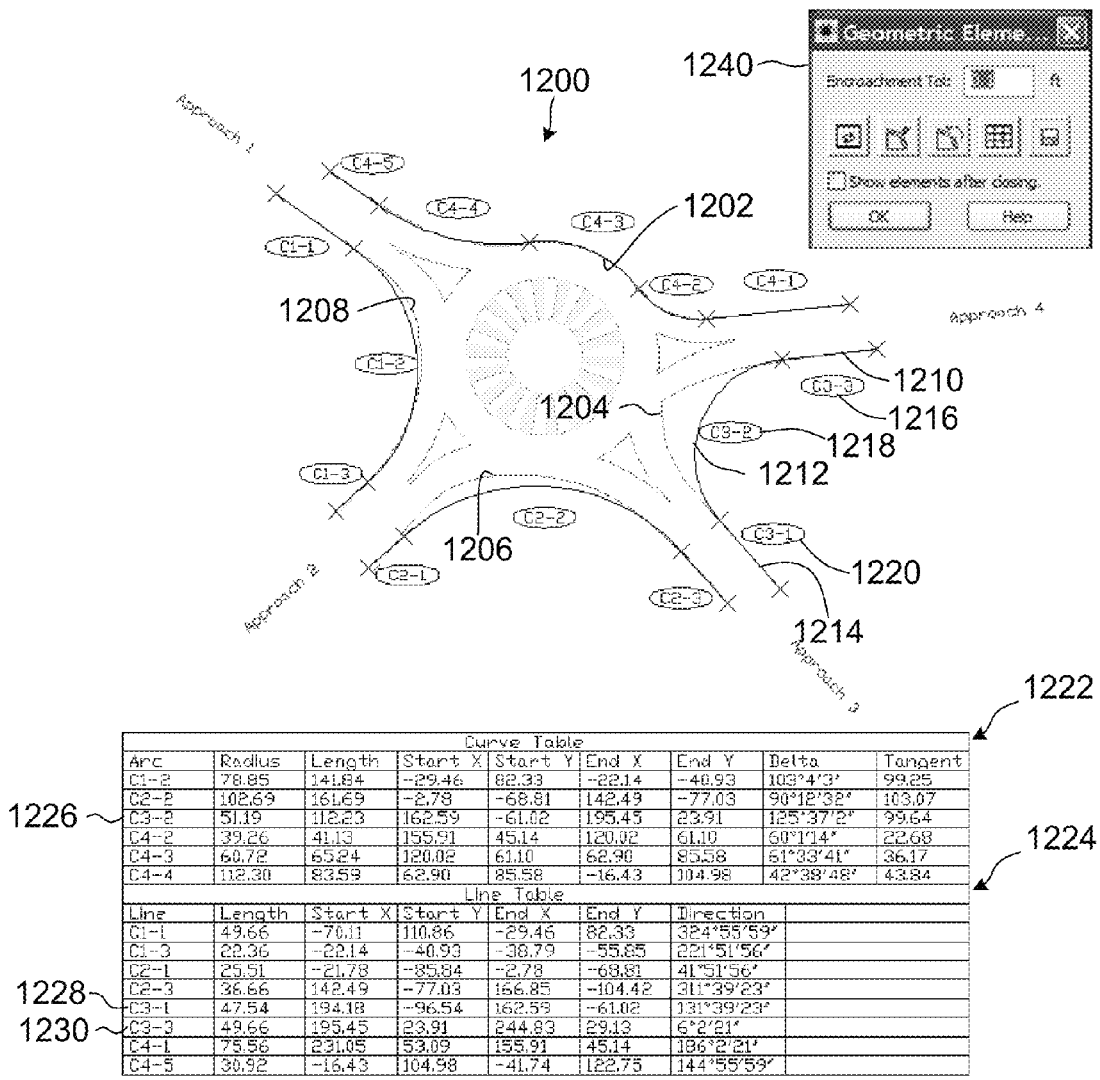
FIG. 28 is a plan view of a traffic roundabout defined by geometric elements displayed in accordance with yet another embodiment of the invention.

Referring to FIG. 28, a traffic roundabout representation is shown generally at 1200. The intersection representation 1200 includes outer edges 1202, 1204, 1206, and 1208, which have been generated in accordance with the processes as described above.

The traffic roundabout further includes a plurality of geometric elements for constructing the outer edges 1202-1208. For example, a plurality of geometric elements 1210, 1212, and 1214 correspond to the outer edge 1204. In the embodiment shown, the outer edge 1204 is approximated by line geometric elements 1210 and 1214 and an intervening arc geometric element 1212. Each of the geometric elements 1210-1214 has a corresponding identifier 1216, 1218, and 1220 respectively for identifying the geometric element.

The traffic roundabout representation also includes a curve table 1222 and a line table 1224. The curve table 1222 has an entry 1226, which lists a plurality of values defining the geometric element 1212, including a radius, a length, start and end coordinates, a delta value and a tangent value. The delta value is the angle between approach 3 and approach 4, which generally corresponds to the angle between the line elements 1214 and 1210. The values listed at 1226 may be used by a surveyor or construction crew to determine actual construction locations for the geometric element 1212. The line table 1224 also includes entries 1228 and 1230 for the geometric elements 1214 and 1210 respectively, including values for length, start and end coordinates, and direction. Similarly, the outer edges 1202-1208 are also each subdivided into a plurality of segments, and a best fit line or curve is approximated for each segment.

In one embodiment, an operator interface 1240 may be provided for entering an encroachment tolerance dimension. The encroachment tolerance dimension is a limit on an extent of encroachment of the geometric elements onto the circulatory and approach lanes.

Figure 29:
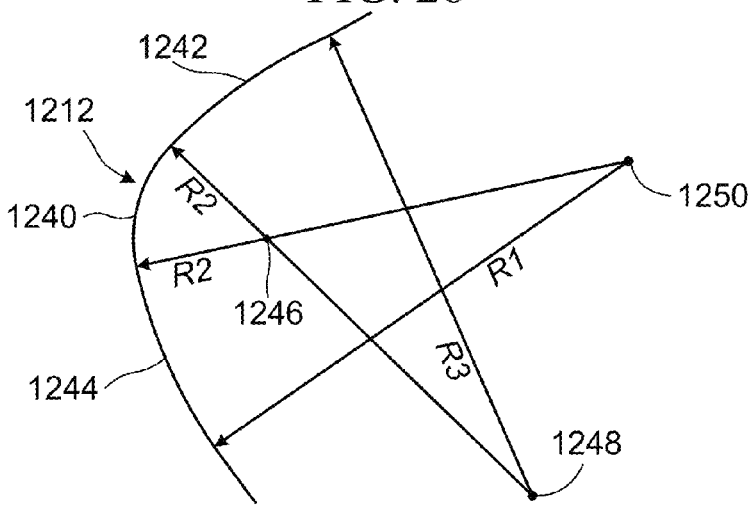
FIG. 29 is a schematic view of a compound curve used in representing the geometric elements shown in FIG. 28.

Referring to FIG. 29, in one embodiment the arc element 1212 may be further subdivided into a three-centered compound curve to provide a better agreement with the outer edge 1204. The three-centered curve comprises a first portion 1240 having a center located at 1246 and a radius $R_2$. The equal radii $R_2$ are extended rearward to define centers 1248 and 1250. A radius $R_3$ extending from the center 1248 defines a second arc portion 1242 and the radius $R_1$ extending from the center 1250 defines a third arc portion 1244. The three-centered curve is well known in geometric design, and facilitates generation of geometric elements that better represent the intended roundabout layout.

Similarly, geometric elements may be generated for the intersection shown in FIG. 3 and FIG. 10 in accordance with the same process. In one alternative embodiment, outer edges may be generated and then adjusted to produce geometric elements as shown in FIG. 28. In another alternative embodiment, the vehicle extents may be used to generate geometric elements that are offset by a minimum offset distance from the vehicle extent locations.

Advantageously, the use of geometric elements for constructing the traffic roundabout 1200 permits the construction crew to work with simple geometric shapes rather than possibly more complex shapes of the outer edges determined in accordance with the above processes.

Dual Lane Embodiment

Figure 30:
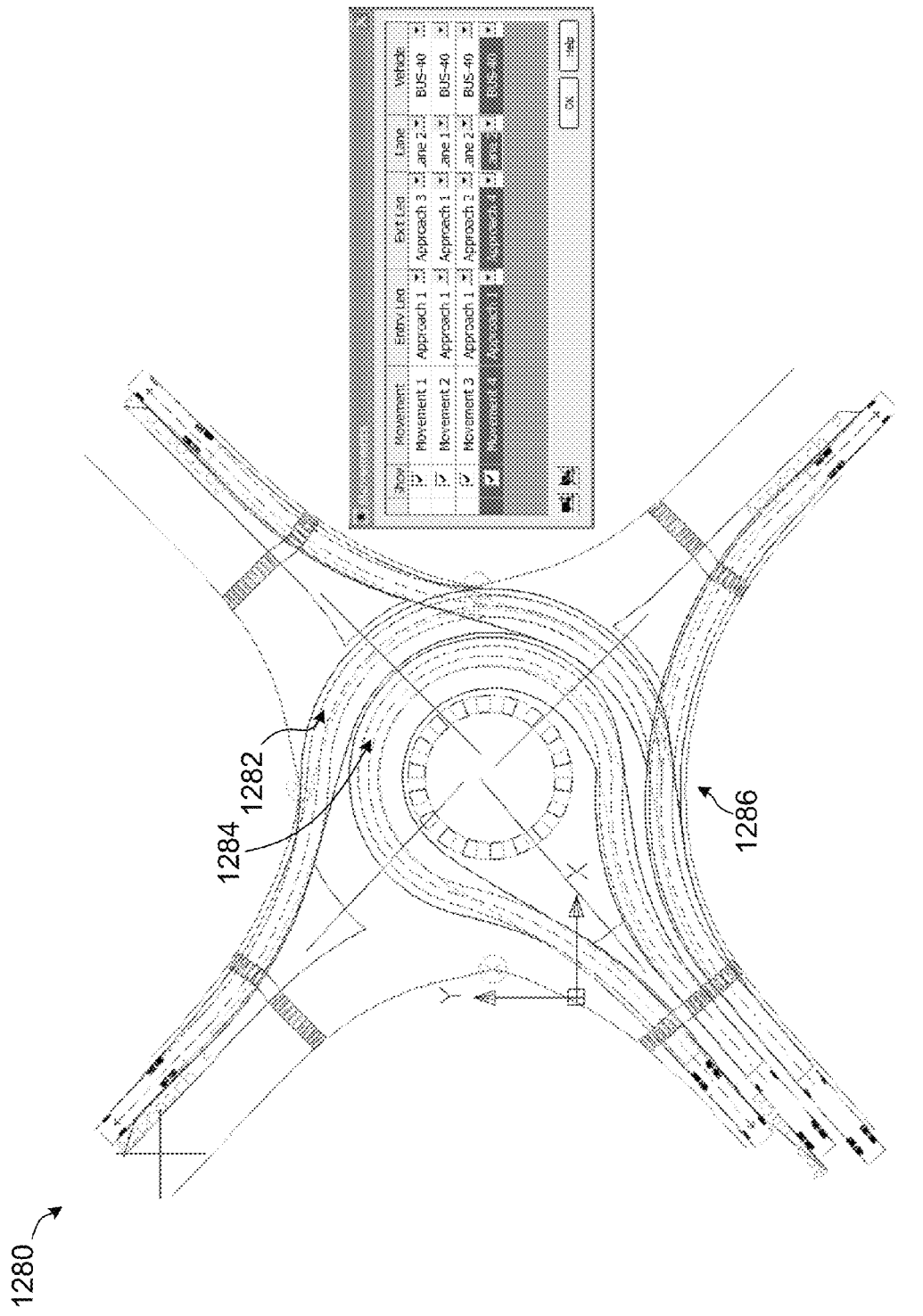
FIG. 30 is a representation of a dual lane roundabout in accordance with another embodiment of the invention.

In some embodiments the intersection 250 shown in FIG. 3, or the roundabout 600 shown in FIG. 13 may include more than one side-by-side lane for conveying traffic in the same direction. In general, the processes described above may be extended to represent multiple lane intersections. Referring to FIG. 30, a multiple lane roundabout representation 1280 is shown generally at 1280. A roundabout 1286 includes a first circulatory path 1282 and a second adjacent circulatory path 1284. Generating the representation of the roundabout 1286 involves first generating the first circulatory path 1282 as described above in the process 900 shown in FIG. 20 and then generating the second circulatory path 1284 adjacent to the first circulatory path. The first and second circulatory paths 1282 and 1284 may be separated by an offset to provide a clearance allowance or may even be permitted to encroach on each other by a pre-defined amount, should is be decided that two design vehicles would not be permitted pass simultaneously through the circulatory path.

Advantageously in the embodiments described herein, the generation of the intersection representations is performed with sufficient computational efficiency to provide near real time changes to the layout of the intersection when running on standard performance hardware. Permitting near real time changes to be made in response to operator input facilitates more efficient and interactive design of intersections, since changes are responded to by regenerating the representation so that their effect can be immediately seen. This near real time performance reduces the need for an iterative design process when designing intersections.

While specific embodiments of the invention have been described and illustrated, such embodiments should be considered illustrative of the invention only and not as limiting the invention as construed in accordance with the accompanying claims.

What is claimed is:

1. A method for generating a representation of a roundabout for display via a computer, the method comprising:
 receiving, via an electronic device, an operator selection of a design vehicle that is expected to use the roundabout;
 receiving operator input of a design dimension for the roundabout, said roundabout including a central island surrounded by a circulatory lane, said design dimension defining a size of one of:
  the central island; and
  an outer perimeter of the circulatory lane;
 generating a circulatory path of said design vehicle traveling within said design dimension along said circulatory lane, said generating of the circulatory path based on said selected design vehicle and said design dimension;

generating vehicle extent locations based on said selected design vehicle and said generated circulatory path, the vehicle extent locations indicating passage of said design vehicle along said circulatory path;

generating a circulatory lane width based on said generated vehicle extent locations; and generating the representation of the roundabout based on said generated circulatory lane width and said received design dimension.

2. The method of claim 1 further comprising:

receiving operator input defining a change to said circulatory lane;

regenerating said circulatory path of said design vehicle based on said received operator input defining the change to said circulatory lane;

regenerating said vehicle extent locations based on said regenerated circulatory path;

generating a modified circulatory lane width based on said regenerated vehicle extent locations; and generating signals representing a modified version of the roundabout based on said regenerated circulatory lane width and said received circulatory lane.

3. The method of claim 1 wherein said vehicle extent locations comprise locations of at least one of:

a wheel of said design vehicle; and a point located on a body of said design vehicle.

4. The method of claim 1 wherein generating said circulatory path comprises generating a circulatory path centerline for said design vehicle to follow, said circulatory path centerline being spaced apart from said design dimension onto said circulatory lane by a sufficient distance to facilitate passage of said design vehicle along the circulatory lane.

5. The method of claim 4 wherein said design vehicle is defined by a plurality of design vehicle parameters and wherein generating said circulatory path centerline comprises:

reading a track width parameter associated with said design vehicle; and generating a circulatory path centerline that is offset from said design element onto said circulatory lane by distance corresponding to half of the track width of said design vehicle.

6. The method of claim 5 wherein receiving said operator input of said design dimension comprises receiving a diameter of a circular central island and wherein generating said circulatory path centerline comprises computing a circulatory path centerline diameter based on a relationship amongst:

the diameter of said circular path centerline;

the diameter of the outer perimeter of the roundabout;

a first offset distance; and the track width of a front axle group of the design vehicle.

7. The method of claim 5 wherein receiving said operator input of said design dimension comprises receiving a diameter of the outer perimeter of a circular circulatory lane and wherein generating said circulatory path centerline comprises computing a circulatory path centerline diameter based on a relationship amongst:

the diameter of said circular path centerline;

the diameter of the central island;

a second offset distance; and the track width of a rear axle group of the design vehicle.

8. The method of claim 5 wherein generating said circulatory path centerline comprises offsetting said circulatory path centerline by a first offset distance to provide a first clearance allowance for said design vehicle travelling along the circulatory lane.

9. The method of claim 8 wherein computing said circulatory lane width comprises adding a second offset distance to said vehicle extent locations to provide a second clearance allowance for said design vehicle travelling along the circulatory lane.

10. The method of claim 4 wherein said design vehicle is defined by a plurality of design vehicle parameters and said design vehicle comprises at least one pair of front wheels and at least one pair of rear wheels, said front wheels and said rear wheels being spaced apart by a wheelbase dimension and at least one of said front wheels and said rear wheels being steerable, and wherein generating said vehicle extent locations of said design vehicle comprises:

generating a bicycle model of said design vehicle, said bicycle model corresponding to said design vehicle and having a front wheel and a rear wheel separated by a corresponding wheelbase dimension, said front wheel and said rear wheel being centrally located with respect to the respective front and rear wheels of the design vehicle, at least one of said front wheel and said rear wheel of said bicycle model being steerable in correspondence with said design vehicle;

for each of a plurality of locations of said front wheel along said circulatory path centerline, orienting said front wheel tangent to said circulatory path centerline at said location and generating a corresponding location of said rear wheel of said bicycle model; and generating said vehicle extent locations of said design vehicle based on said plurality of locations of said front wheel and said rear wheel and said design vehicle parameters.

11. The method of claim 10 wherein said design vehicle comprises an articulated vehicle having a tractor portion and a trailer portion connected to the tractor portion at a pivot location, and wherein said at least one pair of front wheels and at least one pair of rear wheels are located on said tractor portion, said trailer portion having at least one pair of trailing wheels spaced apart from said pivot location by a trailer wheelbase dimension, and wherein generating said bicycle model further comprises generating a bicycle model having a pivot location corresponding to said pivot location of said articulated vehicle and a trailing wheel centrally located with respect to trailing wheels of the trailer portion of the design vehicle and being spaced apart from said trailer wheelbase dimension, and wherein generating said vehicle extent locations of said design vehicle comprises:

for each of a plurality of locations of said front wheel along said circulatory path centerline, orienting said front wheel tangent to said circulatory path centerline at said location and generating a corresponding location of said rear wheel of said bicycle model;

generating a corresponding location of said trailing wheel of said bicycle model; and generating said vehicle extent locations of said design vehicle based on said plurality of locations of said front wheel and said trailing wheel and said design vehicle parameters.

12. The method of claim 4 further comprising:

determining whether said circulatory path centerline meets a minimum turning circle criterion associated with said design vehicle; and generating a warning signal when said criterion is not met.

13. The method of claim 1 wherein said central island comprises a mountable truck apron portion located adjacent to said circulatory lane and further comprising receiving operator input of a width of the truck apron portion and wherein generating the representation further comprises generating signals further representing the truck apron portion of the central island.

14. The method of claim 1 wherein said central island comprises a mountable truck apron portion located adjacent to said circulatory lane and further comprising:
receiving an operator selection of a truck apron design vehicle;
generating a circulatory path of said truck apron design vehicle traveling within an outer perimeter of said circulatory lane;
determining an extent of encroachment on the central island by the truck apron design vehicle associated with passage of said design vehicle along said circulatory path; and
generating a width of said truck apron portion of said central island based on said extent of encroachment.

15. The method of claim 1 further comprising receiving data defining an orientation of an approach to the roundabout and generating signals representing relative locations of the approach and the roundabout.

16. The method of claim 15 further comprising:
generating an approach path of said design vehicle between said approach and said circulatory lane;
generating vehicle extent locations associated with passage of said design vehicle between said approach and said circulatory lane; and
generating an outer edge of said roundabout between said approach and said outer perimeter of said circulatory lane, said outer edge being generally aligned with selected ones of said vehicle extent locations.

17. The method of claim 16 wherein generating said outer edge of said roundabout comprises generating at least one curve portion identifying said outer edge, said at least one curve portion being outwardly spaced apart from said vehicle extent locations associated with passage of said design vehicle between said approach and said circulatory roadway.

18. The method of claim 16 wherein generating said approach path comprises generating an approach path comprising:
an approach portion aligned with said approach to the roundabout; and
a generally circular arc portion extending from said approach portion to said circulatory path, said circular arc portion being defined by an approach radius selected to cause said circular arc to form a tangent to said circulatory path at a point where said approach path meets said circulatory path.

19. The method of claim 18 further comprising receiving operator input of said approach radius.

20. The method of claim 16 wherein said approach comprises an entry lane to the roundabout and an exit lane from the roundabout and wherein generating said approach path comprises generating an entry path and an exit path.

21. The method of claim 20 further comprising generating a splitter island envelope separating said entry lane and said exit lane proximate said circulatory lane, said splitter island being located between, and spaced apart from said entry path and an exit path by an offset distance to provide a clearance allowance for the design vehicle entering the roundabout on said entry lane or exiting the roundabout on said exit lane.

22. The method of claim 16 wherein said approach comprises an entry lane to the roundabout and wherein said roundabout further comprises at least one exit lane from the roundabout, and further comprising:
receiving an operator selection of a fastest path design vehicle;
generating a fastest path for the fastest path design vehicle travelling through the roundabout between the entry lane and the exit lane, said fastest path being spaced apart from said outer edge of said roundabout and said central island by a plurality of fastest path offsets; and
generating a speed of the fastest path design vehicle at a plurality of locations along said fastest path.

23. The method of claim 22 further comprising:
receiving operator input defining a change to said roundabout;
regenerating said fastest path based at least in part on said change to said roundabout; and
regenerating said speed of said fastest path design vehicle at said plurality of locations along said fastest path based on the regenerated said fastest path.

24. The method of claim 22 wherein generating said fastest path comprises:
receiving operator input of said fastest path offsets, said fastest path offsets defining respective points along said fastest path; and
generating a plurality of curved path portions joined end to end and passing through said respective points, said curved path portions defining said fastest path.

25. The method of claim 24 wherein computing said fastest path design vehicle speeds comprises, for each of said plurality of curved path portions:
determining a radius of said curved path portion;
generating a fastest path design vehicle speed along said curved path portion based on a relationship amongst:
a speed of the design vehicle in kilometers per hour;
the radius of said curved path portion in meters;
a superelevation parameter of the circulatory lane proximate the curved path portion; and
a side friction factor.

26. The method of claim 24 wherein generating said plurality of curved path portions comprises one of:
generating a plurality of end-to-end joined circular arc portions; and
generating a cubic spline curve passing through said respective points along said fastest path.

27. The method of claim 16 further comprising generating a plurality of geometric elements representing said outer edge of said roundabout, each geometric element representing at least a portion of the outer edge and having associated data defining a location and a shape of said geometric element.

28. The method of claim 27 further comprising generating signals identifying said geometric elements and said associated data on said roundabout.

29. The method of claim 27 further comprising generating signals operable to cause a printer to print a plan of the roundabout including said geometric elements.

30. The method of claim 15 wherein receiving said data defining said orientation of said approach comprises receiving operator input of a reference line defining said location of said approach.

31. The method of claim 15 further comprising:
receiving operator input defining a change in location of the circulatory lane with respect to said approach;
regenerating said approach path of said design vehicle based on the change in location of the circulatory lane;
regenerating said vehicle extent locations based on passage of said design vehicle between said approach and said circulatory roadway; and regenerating said outer edge of said roundabout based at least in part on said regenerated approach path and said regenerated vehicle extent location.

32. The method of claim 1 further comprising storing data defining the representation of the roundabout in a computer memory.

33. The method of claim 1 further comprising generating signals operable to cause a hardcopy output device to produce a printed plan of the representation of the roundabout.

34. The method of claim 1 wherein said circulatory lane comprises at least two side-by-side traffic lanes and wherein:
generating said circulatory path of said design vehicle traveling within said roundabout dimension along said circulatory lane comprises generating side-by-side circulatory paths of said design vehicle traveling within said roundabout dimension;
generating vehicle extent locations comprises generating vehicle extent locations for each of said side-by-side circulatory paths; and
generating said circulatory lane width based at least in part on said generated vehicle extent locations.

35. The method of claim 34 wherein generating said side-by-side circulatory paths of said design vehicle comprises generating side-by-side circulatory paths that are spaced apart sufficiently to permit simultaneous passage of said design vehicle on each of said circulatory paths through the roundabout.

36. The method of claim 1, wherein said generating the circulatory path, said generating vehicle extent locations, said generating the circulatory lane width, and said generating the representation of the roundabout are performed upon receiving the operator selection of the design vehicle and the operator input of a design dimension.

37. An apparatus for generating a representation of a roundabout for display, the apparatus comprising a processor circuit operably configured to:
receive an operator selection of a design vehicle that is expected to use the roundabout;
receive operator input of a design dimension for the roundabout, said roundabout including a central island surrounded by a circulatory lane, said design dimension defining a size of one of:
the central island; and
an outer perimeter of the circulatory lane;
generate a circulatory path of said design vehicle traveling within said design dimension along said circulatory lane, said generating of the circulatory path based on said selected design vehicle and said design dimension;
generate vehicle extent locations based on said selected design vehicle and said generated circulatory path, the vehicle extent locations indicating passage of said design vehicle along said circulatory path;
generate a circulatory lane width based on said generated vehicle extent locations; and
generate the representation of the roundabout based on said generated circulatory lane width and said received design dimension.

38. The apparatus of claim 37 wherein said processor circuit is operably configured to:
receive operator input defining a change to said circulatory lane;
regenerate said circulatory path of said design vehicle based on said received operator input defining the change to said circulatory lane;
regenerate said vehicle extent locations based on said regenerated circulatory path;
generating a modified circulatory lane width based on said regenerated vehicle extent locations; and
generate signals representing a modified version of the roundabout based on said regenerated circulatory lane width and said received circulatory lane.

39. A computer readable medium encoded with codes for directing a processor circuit to generate a representation of a roundabout, the codes for directing the processor circuit to:
receive an operator selection of a design vehicle that is expected to use the roundabout;
receive operator input of a design dimension for the roundabout, said roundabout including a central island surrounded by a circulatory lane, said design dimension defining a size of one of:
the central island; and
an outer perimeter of the circulatory lane;
generate a circulatory path of said design vehicle traveling within said design dimension along said circulatory lane, said generating of the circulatory path based on said selected design vehicle and said design dimension;
generate vehicle extent locations based on said selected design vehicle and said generated circulatory path, the vehicle extent locations indicating passage of said design vehicle along said circulatory path;
generate a circulatory lane width based on said generated vehicle extent locations; and
generate the representation of the roundabout based on said generated circulatory lane width and said received design dimension.

40. A method for generating a representation of a traffic intersection for display via a computer, the method comprising:
receiving, via an electronic device, operator input defining a relative orientation between a first roadway and a second roadway, said first and second roadways forming an intersection area therebetween;
receiving an operator selection of a design vehicle that is expected to use the traffic intersection;
generating at least one turning path of said design vehicle through the intersection between said first roadway and said second roadway based on the received relative orientation and said selected design vehicle;
generating first vehicle extent locations based on said selected design vehicle and said at least one turning path, the first vehicle extent locations indicating passage of said design vehicle along said at least one turning path;
generating an outer edge of said intersection area based on said generated first vehicle extent locations, said outer edge being generally aligned with selected ones of said first vehicle extent locations; and
generating the representation of the traffic intersection based on said generated outer edge and said received relative orientation.

41. The method of claim 40, further comprising:
receiving operator input defining a change in said relative orientation between said first roadway and said second roadway;
regenerating said at least one turning path of said design vehicle based on the change in said relative orientation;
regenerating said first vehicle extent locations based on said regenerated at least one turning path and said selected design vehicle;
regenerating said outer edge of said intersection area based on said regenerated first vehicle extent locations; and
generating signals representing an updated version of the traffic intersection based on said regenerated outer edge and said received relative orientation.

42. The method of claim 41 wherein receiving said operator input defining said change comprises receiving at least one of:
- a change in orientation of said first roadway;
- a change in orientation of said second roadway; and
- a change in a location of said intersection area between the first roadway and the second roadway.

43. The method of claim 40 wherein generating said at least one turning path comprises generating a turning path centerline comprising:
- an approach portion aligned with said first roadway;
- a departure portion aligned with said second roadway; and
- a generally circular arc turning portion between said approach portion and said departure portion, said turning portion having a turning radius that meets a minimum turning radius criterion for the design vehicle.

44. The method of claim 43 wherein generating said at least one turning path comprises generating a turning path centerline comprising at least one of:
- a first transition portion joining said approach portion and said turning portion, said first transition portion having a radius that reduces between said approach portion and said turning portion; and
- a second transition portion joining said turning portion and said departure portion, said second transition portion having a radius that increases between said turning portion and said departure portion.

45. The method of claim 43 further comprising computing said minimum turning radius based on a relationship amongst:
- the radius of said generally circular arc third portion in meters;
- a speed of the design vehicle in kilometers per hour;
- a superelevation parameter associated with said first and second roadways; and
- a side friction factor.

46. The method of claim 45 further comprising receiving operator input of a speed of said design vehicle for computing said minimum turn radius.

47. The method of claim 43 wherein said design vehicle is defined by a plurality of design vehicle parameters and wherein generating said first vehicle extent locations of said design vehicle comprises:
- generating a bicycle model of said design vehicle, said bicycle model having a front wheel and a rear wheel, each being centered between respective front and rear wheels of the design vehicle and being separated by a wheelbase dimension corresponding to a wheelbase dimension of said design vehicle, at least one of said front wheel and said rear wheel being steerable;
- for each of a plurality of locations of said front wheel along said turning path centerline, orienting said front wheel tangent to said turning path centerline at said location and generating a corresponding location of said rear wheel of said bicycle model; and
- generating said first vehicle extent locations of said design vehicle based on said plurality of locations of said front wheel and said rear wheel and said design vehicle parameters.

48. The method of claim 47 wherein said first vehicle extent locations comprise locations of at least one of:
- a wheel of said design vehicle; and
- a point located on a body of said design vehicle.

49. The method of claim 40 wherein receiving operator input defining said relative orientation between said first roadway and said second roadway comprises receiving operator input of a first reference line defining an orientation of said first roadway and a second reference line defining an orientation of said second roadway, said second reference line being disposed at an angle to said first reference line.

50. The method of claim 40 wherein generating said outer edges of said intersection area comprises generating at least one curve portion identifying said outer edges, said at least one curve portion being outwardly spaced apart from said first vehicle extent locations by an offset distance.

51. The method of claim 50 wherein generating said at least one curve portion comprises generating a curve portion being outwardly spaced apart from said first vehicle extent locations by an offset distance that varies along said curve portion.

52. The method of claim 40 wherein generating said representation comprises generating signals for each of: said first roadway, said second roadway, and said outer edges of said intersection area.

53. The method of claim 40 wherein said first roadway comprises a first lane extending through the traffic intersection and defining a first area of the roadway for passage of a single line of vehicles in a first direction along said roadway, and wherein said second roadway comprises a second lane defining a second area of the roadway for passage of a single line of vehicles away from said intersection and a third lane defining a third area of the roadway for passage of a single line of vehicles toward said intersection and wherein generating said at least one turning path comprises:
- generating a first turning path of said design vehicle turning from said first lane, through said intersection area onto said second lane; and
- generating a second turning path of said design vehicle turning from said third lane, through said intersection area onto said first lane.

54. The method of claim 40 further comprising generating a plurality of geometric elements representing said outer edge of said intersection area, each geometric element representing at least a portion of the outer edge and having associated data defining a location and a shape of said geometric element.

55. The method of claim 54 further comprising generating signals identifying said geometric elements and said associated data on said traffic intersection.

56. The method of claim 54 further comprising generating signals operable to cause a printer to print a plan of the traffic intersection including said geometric elements.

57. The method of claim 40 further comprising storing data defining the representation of the traffic intersection in a computer memory.

58. The method of claim 40 further comprising generating signals operable to cause a hardcopy output device to produce a printed plan of the representation of the traffic intersection.

59. An apparatus for generating a representation of a traffic intersection for display, the apparatus comprising a processor circuit operably configured to:
- receive operator input defining a relative orientation between a first roadway and a second roadway, said first and second roadways forming an intersection area therebetween;
- receive an operator selection of a design vehicle that is expected to use the traffic intersection;
- generate at least one turning path of said design vehicle through the intersection between said first roadway and said second roadway based on the received relative orientation and said selected design vehicle;
- generate first vehicle extent locations based on said selected design vehicle and said at least one turning path, the first vehicle extent locations indicating passage of said design vehicle along said at least one turning path;

generate an outer edge of said intersection area based on said generated first vehicle extent locations, said outer edge being generally aligned with selected ones of said first vehicle extent locations; and generate the representation of the traffic intersection based on said generated outer edge and said received relative orientation.

60. The apparatus of claim 59, wherein said processor circuit is operably configured to:

receive operator input defining a change in said relative orientation between said first roadway and said second roadway;

regenerate said at least one turning path of said design vehicle based on the change in said relative orientation;

regenerating said first vehicle extent locations based on said regenerated at least one turning path and said selected design vehicle;

regenerate said outer edge of said intersection area based on said regenerated first vehicle extent locations; and generate signals representing an updated version the traffic intersection based on said regenerated outer edge and said received relative orientation.

61. The apparatus of claim 60 wherein said processor circuit is operably configured to receive said operator input defining said change by receiving at least one of:

a change in orientation of said first roadway;

a change in orientation of said second roadway; and a change in a location of said intersection area between the first roadway and the second roadway.

62. A non-transitory computer readable medium encoded with codes for directing a processor circuit to generate a representation of a traffic intersection, the codes for directing the processor circuit to:

receive operator input defining a relative orientation between a first roadway and a second roadway, said first and second roadways forming an intersection area therebetween;

receive an operator selection of a design vehicle that is expected to use the traffic intersection;

generate at least one turning path of said design vehicle through the intersection between said first roadway and said second roadway based on the received relative orientation and said selected design vehicle;

generate first vehicle extent locations based on said selected design vehicle and said at least one turning path, the first vehicle extent locations indicating passage of said design vehicle along said at least one turning path;

generate an outer edge of said intersection area based on said generated first vehicle extent locations, said outer edge being generally aligned with selected ones of said first vehicle extent locations; and generate the representation of the traffic intersection based on said generated outer edge and said received relative orientation.

* * * * *